US008557502B2

(12) United States Patent
Furukawa

(10) Patent No.: US 8,557,502 B2
(45) Date of Patent: Oct. 15, 2013

(54) NEGATIVE PHOTOSENSITIVE COMPOSITION, PARTITION WALLS FOR OPTICAL DEVICE USING IT AND OPTICAL DEVICE HAVING THE PARTITION WALLS

(75) Inventor: Yutaka Furukawa, Tokyo (JP)

(73) Assignee: Asahi Glass Company, Limited, Tokyo (JP)

( * ) Notice: Subject to any disclaimer, the term of this patent is extended or adjusted under 35 U.S.C. 154(b) by 212 days.

(21) Appl. No.: 13/012,939

(22) Filed: Jan. 25, 2011

(65) Prior Publication Data

US 2011/0117333 A1 May 19, 2011

Related U.S. Application Data

(63) Continuation of application No. PCT/JP2009/063690, filed on Jul. 31, 2009.

(30) Foreign Application Priority Data

Aug. 1, 2008 (JP) .................................. 2008-199863

(51) Int. Cl.
| | | |
|---|---|---|
| G03F 7/00 | (2006.01) | |
| G03F 7/004 | (2006.01) | |
| G03F 7/028 | (2006.01) | |
| G03F 7/027 | (2006.01) | |

(52) U.S. Cl.
USPC .................. 430/281.1; 430/270.1; 430/286.1; 430/913; 430/927

(58) Field of Classification Search
USPC .......................... 430/270.1, 281.1, 286.1, 913
See application file for complete search history.

(56) References Cited

U.S. PATENT DOCUMENTS

| 6,419,732 B1 * | 7/2002 | Matsumura et al. | ........ 106/31.75 |
|---|---|---|---|
| 6,451,436 B1 * | 9/2002 | Komatsu et al. | ............. 428/447 |

(Continued)

FOREIGN PATENT DOCUMENTS

| JP | 2000-234024 | 8/2000 |
|---|---|---|
| JP | 2002-22933 | 1/2002 |

(Continued)

OTHER PUBLICATIONS

Translation of JP_2007-002194(Jan. 2007).*

(Continued)

*Primary Examiner* — Amanda C. Walke
(74) *Attorney, Agent, or Firm* — Oblon, Spivak, McClelland, Maier & Neustadt, L.L.P.

(57) ABSTRACT

To provide a negative photosensitive composition applicable to preparation of partition walls which can maintain excellent ink repellency even after ink affinity-imparting treatment, and partition walls for an optical device using such a composition. A negative photosensitive composition comprising the following ink repellent (A) in an amount of from 0.01 to 10 mass % to the total amount, a photosensitive resin (B) having an acidic group and an ethylenic double bond in one molecule, and a photopolymerization initiator (C), and partition walls for an optical device using such a composition:

Ink repellent (A): a hydrolyzed condensate of at least three hydrolyzable silane compounds, the three hydrolyzable silane compounds respectively selected from a trifunctional hydrolyzable silane compound having a $C_{3-10}$ perfluoroalkyl group which may contain an etheric oxygen atom, a bi- to tetrafunctional hydrolyzable silane compound, and a bi- or trifunctional hydrolyzable silane compound having a (meth)acryloyl group, which has a fluorine atom content of from 10 to 55 mass %.

20 Claims, 1 Drawing Sheet

(56) References Cited

U.S. PATENT DOCUMENTS

| | | | |
|---|---|---|---|
| 6,562,465 B1 * | 5/2003 | Nakashima et al. | 428/412 |
| 7,745,094 B2 * | 6/2010 | Nakashima et al. | 430/270.1 |
| 7,985,477 B2 * | 7/2011 | Schmidt et al. | 428/413 |
| 2006/0154091 A1 | 7/2006 | Schmidt et al. | |

FOREIGN PATENT DOCUMENTS

| | | |
|---|---|---|
| JP | 2006-154804 | 6/2006 |
| JP | 2007-002194 | 1/2007 |
| JP | 2008-248239 | 10/2008 |
| WO | 2004/079454 | 9/2004 |
| WO | WO 2005/014745 A1 | 2/2005 |
| WO | 2007-132892 | 11/2007 |

OTHER PUBLICATIONS

Machine translation of JP2000-212443 (no date).*
Machne translation of JP 2006-154804 (no date).*
Extended European Search Report issued on Sep. 12, 2011 in the corresponding Application No. 09803054.7.
International Search Report issued Aug. 25, 2009 in PCT/JP09/063690 filed Jul. 31, 2009.

* cited by examiner

Fig. 1 (I)
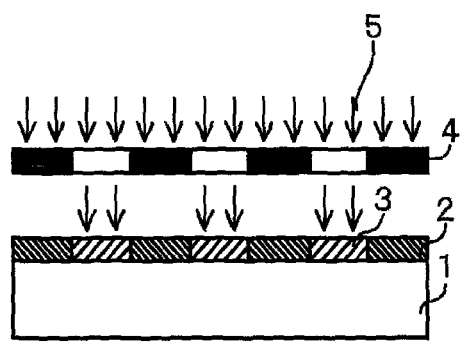
Fig. 1 (II)
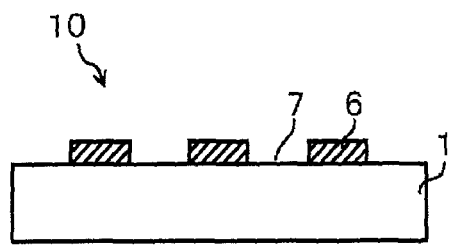
Fig. 1 (III)

NEGATIVE PHOTOSENSITIVE COMPOSITION, PARTITION WALLS FOR OPTICAL DEVICE USING IT AND OPTICAL DEVICE HAVING THE PARTITION WALLS

CROSS REFERENCE TO RELATED APPLICATION

This application is a continuation of PCT/JP2009/063690, filed on Jul. 31, 2009, and claims priority to Japanese Patent Application No. 2008-199863, filed on Aug. 1, 2008.

TECHNICAL FIELD

The present invention relates to a negative photosensitive composition, partition walls for an optical device using it, a process for producing the partition walls, and a process for producing an optical device having a plurality of pixels partitioned by partition walls, such as a color filter, an organic EL display device or an organic TFT array, using an ink jet method.

BACKGROUND ART

A resist composition has attracted attention as a material to form a permanent film for e.g. partition walls between pixels of a color filter, partition walls between pixels of an organic EL (electro-luminescence) display device, partition walls partitioning TFTs (thin film transistors) of an organic TFT array, partition walls for ITO electrodes of a liquid crystal display device, and partition walls of a circuit wiring substrate.

Further, a low cost process utilizing ink jet recording technology of injecting a liquid by an ink jet after formation of the above partition walls, has been proposed.

For example, in the production of a color filter, an ink jet method has been proposed to jet and apply R (red), G (green) and B (blue) inks within fine pixels. Here, formation of a pixel pattern is carried out by photolithography using a resist composition, and a coating film cured product of the resist composition is utilized as partition walls between pixels.

Further, in the production of an organic EL display device, an ink jet method has been proposed wherein a solution of a hole transport material or a luminescent material is jetted and applied to form hole transport layers or luminescent layers within fine pixels. Here, formation of a pixel pattern is carried out by photolithography using a resist composition, and a coating film cured product of the resist composition is utilized as partition walls between pixels.

Further, in the production of an organic TFT array, an ink jet method has been proposed wherein a solution of an organic semiconductor is jetted and applied. Formation of partition walls partitioning TFTs is carried out by photolithography using a resist composition, and a coating film cured product of the resist composition is utilized as the partition walls.

Further, in the production of a liquid crystal display device, an ink jet method has been proposed wherein an ITO (tin doped indium oxide) solution or dispersion is jetted and applied to form ITO electrodes, and formation of an ITO electrode pattern is carried out by photolithography using a resist composition, and a coating film cured product of the resist composition is utilized as partition walls.

Further, in the production of a circuit wiring substrate, an ink jet method has been proposed wherein a metal dispersion is jetted and applied to form circuit wirings. Here, formation of a circuit wiring pattern is carried out by photolithography using a resist composition, and a coating film cured product of the resist composition is utilized as partition walls.

In the ink jet method, it is necessary to prevent e.g. color mixing of inks between adjacent pixels, or to prevent the material jetted by an ink jet from attaching to or solidifying at portions other than the predetermined regions. Accordingly, the partition walls are required to have repellency against water or an organic solvent constituting the ink jet coating solution, i.e. a so-called ink repellency.

Accordingly, a resist composition to form partition walls having an ink repellency has been proposed. For example, Patent Document 1 discloses a photosensitive resin composition comprising a silicon-containing resin having a polyfluoroalkyl group, a polydimethylsiloxane group and an ethylenic double bond.

However, if partition walls for e.g. a color filter, an organic EL display device or an organic TFT array is prepared by using a composition to impart such an ink repellency, so-called edge leakage is likely to take place wherein the thickness of the ink layer in the vicinity of partition walls becomes thin, and the periphery of the partition walls look white.

When partition walls are formed by a coating film cured product of a resist composition, the resist composition at a portion to be dots (regions within which an ink is to be injected, surrounded by the partition walls) is removed in a development step. However, if a resist composition to impart ink repellency to the partition walls is used, if its removal is insufficient, the residue of the composition will adversely affect the ink injection, and such is one cause of the above edge leakage. Further, the partition walls are made of a coating film cured product of the resist composition, and molecules which did not undergo curing reaction remain in the partition walls, and such molecules migrate from the partition walls to the dots and contaminate the dots in the subsequent post-baking step, and such contamination is also considered to be one cause of the above edge leakage.

In order to prevent the edge leakage, for the purpose of removing impurities remaining in the dots after formation of the partition walls, for example, it is considered to carry out an ink affinity-imparting treatment such as cleaning with an alkali aqueous solution, UV cleaning, UV ozone cleaning, excimer cleaning, corona discharge treatment or oxygen plasma treatment. However, if an ink affinity-imparting treatment is carried out by such a method, the ink repellency of the partition walls is also decreased. As a method of carrying out an ink affinity-imparting treatment without decreasing the ink repellency of the partition walls e.g. by UV cleaning, Patent Document 2 proposes a method of protecting the partition walls with a resin, but this method is complicated since a step of removing the resin is required. Further, Patent Document 3 proposes use of a siloxane compound having a specific structure as a UV ozone-resistant resin, but there may be a problem in the adhesion to a substrate since it is a positive composition.

Therefore, a negative photosensitive composition for formation of partition walls of an optical device, having ink repellency capable of withstanding an ink affinity-imparting treatment such as UV ozone cleaning and at the same time capable of forming dots excellent in the ink wettability, has been desired.

PRIOR ART

Patent Documents

Patent Document 1: WO2004/079454
Patent Document 2: JP-A-2002-22933
Patent Document 3: WO2007/132892

DISCLOSURE OF THE INVENTION

Object to be Accomplished by the Invention

It is an object of the present invention to provide a negative photosensitive composition which can be used for production of partition walls capable of maintaining excellent ink repellency even after an ink affinity-imparting treatment.

Another object of the present invention is to provide partition walls for an optical device capable of maintaining excellent ink repellency even after an ink affinity-imparting treatment, and their production process.

Still another object of the present invention is to provide a process for producing an optical device having partition walls excellent in the ink repellency, in which edge leakage or the like is suppressed.

Means to Accomplish the Object

The present inventor has found that by adding a specific ink repellent to a photosensitive composition to form partition walls, ink affinity is imparted to dots without decreasing the ink repellency of the partition walls e.g. by UV ozone treatment, and accomplished the present invention.

The present invention provides a negative photosensitive composition comprising the following ink repellent (A), a photosensitive resin (B) having an acidic group and an ethylenic double bond in one molecule, and a photopolymerization initiator (C), wherein the proportion of the ink repellent (A) is from 0.01 to 10 mass % to the total solid content of the negative photosensitive composition:

ink repellent (A): a hydrolyzed condensate of at least three hydrolysable silane compounds, the three hydrolysable silane compounds respectively selected from a hydrolysable silane compound (a-1) having an organic group having one $C_{3-10}$ perfluoroalkyl group which may contain an etheric oxygen atom and three hydrolysable groups bonded to a silicon atom; a hydrolysable silane compound (a-2) having p (wherein p is 0, 1 or 2) pieces of a hydrocarbon group(s) and (4-p) pieces of hydrolysable groups bonded to a silicon atom; and a hydrolysable silane compound (a-3) having q (wherein q is 1 or 2) pieces of an organic group(s) having a polymerizable functional group selected from an acryloyl group and a methacryloyl group, r (wherein r is 0 or 1 and is a number to achieve q+r=1 or 2) piece of a hydrocarbon group, and (4-q-r) pieces of hydrolysable groups bonded to a silicon atom; which has a fluorine atom content of from 10 to 55 mass %.

The ink repellent (A) to be used for the negative photosensitive composition of the present invention has a side chain having one $C_{3-10}$ perfluoroalkyl group which may contain an etheric oxygen atom bonded to a silicon atom, and accordingly it has surface migration property and migrates to the vicinity of the surface of a coating film in a prebaking step in the after-mentioned production process. In the subsequent exposure step, the curing reaction of the ink repellent (A) is sufficiently carried out. Accordingly, partition walls to be formed can maintain high ink repellency.

Further, it is considered that by the ink affinity-imparting treatment such as UV ozone cleaning, organic substances are decomposed by breakage of the molecular bonds, and the most part of the ink repellent (A) is constituted by organic groups and fluoroorganic groups bonded to silicon atoms, and has such a structure that breakage of the molecular bonds hardly occurs. Accordingly, in a case where ink affinity-imparting treatment (removal of the residue of the composition) is carried out on the dots by the ink affinity-imparting treatment such as UV ozone cleaning, the partition walls produced by the present invention have the ink repellent (A) which is substantially free from breakage of the molecular bonds on their surface, and accordingly a decrease in the ink repellency hardly occurs. Accordingly, by using the ink repellent (A) of the present invention, ink affinity is imparted to the dots without decreasing the ink repellency of the partition walls. That is, the partition walls are excellent in the ink repellency and the dots are excellent in the ink (liquid) affinity, whereby the contrast of ink repellency/ink (liquid) affinity of the partition walls and the dots can be improved.

Accordingly, even when the dropped position of the ink is somewhat displaced onto partition walls at the time of injecting the ink into dots by an ink jet method, the dots are excellent in the ink affinity, whereby ink droplets are led to the dots and the ink tends to hardly remain on the partition walls. That is, the ink flows into the dots in high precision thereby to prevent the color mixing between pixels. Further, the dots are excellent in the ink affinity, whereby the ink is likely to uniformly spread within the dots.

The present invention further provides partition walls for an optical device comprising a support substrate, and a plurality of pixels and partition walls located between the adjacent pixels formed on the support substrate, which are made of a coating film cured product of the negative photosensitive composition of the present invention.

The present invention further provides a process for producing partition walls for an optical device comprising a support substrate, and a plurality of pixels and partition walls located between the adjacent pixels formed on the support substrate, which comprises a step of applying the negative photosensitive composition of the present invention on the support substrate to form a coating film, a prebaking step of heating the coating film, an exposure step of exposing only a portion to be the partition walls of the coating film for photocuring, a development step of removing the coating film other than the photo-cured portion to form partition walls made of the photo-cured portion of the coating film, and a post-baking step of heating the formed partition walls in this order.

The present invention further provides a process for producing an optical device comprising a support substrate, and a plurality of pixels and partition walls located between the adjacent pixels formed on the support substrate, which comprises forming partition walls on the support substrate by the production process of the present invention, applying an ink affinity-imparting treatment to the surface of the support substrate exposed to regions surrounded by the support substrate and the partition walls, and injecting an ink within the regions by an ink jet method to form the pixels.

Effects of the Invention

According to the negative photosensitive composition of the present invention, it is possible to produce partition walls which can maintain excellent ink repellency even after an ink affinity-imparting treatment.

Further, partition walls for an optical device of the present invention can maintain excellent ink repellency even after an ink affinity-imparting treatment.

Further, according to the process for producing partition walls for an optical device of the present invention, it is possible to obtain partition walls which can maintain excellent ink repellency even after an ink affinity-imparting treatment, and according to the process for producing an optical device of the present invention, it is possible to obtain an optical device in which the color mixing between pixels, edge leakage, etc. can be suppressed.

That is, by using the negative photosensitive composition to impart ink repellency of the present invention, it is possible to prepare partition walls for a color filter, an organic EL display device, an organic TFT array, etc. free from edge leakage.

BRIEF DESCRIPTION OF THE DRAWINGS

FIG. 1 is a cross-sectional view schematically illustrating one example of the process for producing partition walls for an optical device of the present invention.

BEST MODE FOR CARRYING OUT THE INVENTION

Now, the present invention will be described in detail with reference to the preferred embodiments of the invention. In this specification, unless otherwise specified, % represents mass %. Further, a (meth)acryloyl group represents a group selected from an acryloyl group and a methacryloyl group and generically means both an acryloyl group and methacryloyl group. In the same manner, a (meth)acrylate generically means both an acrylate and a methacrylate.

<Negative Photosensitive Composition of the Present Invention>

Now, the negative photosensitive composition of the present invention comprising the following ink repellent (A), a photosensitive resin (B) having an acidic group and an ethylenic double bond in one molecule and a photopolymerization initiator (C), wherein the proportion of the ink repellent (A) is from 0.01 to 10 mass % to the total solid content of the negative photosensitive composition, will be described in detail.

[Ink Repellent (A)]

The ink repellent (A) is a composition comprising a hydrolyzed condensate of hydrolyzable silane compounds and having a molecular weight distribution itself. This hydrolyzed condensate is a liquid or a solvent-soluble solid at room temperature, and is one type of a curable silicone usually called silicone resin. The curable silicone is obtainable by hydrolytic condensation of a trifunctional monomer and a bifunctional monomer and in some cases, a small amount of a tetrafunctional monomer or a monofunctional monomer is used in combination. The number of functional groups means the number of hydrolyzable groups bonded to one silicon atom and in some cases, the sum of the number of such hydrolyzable groups and the number of hydroxy groups (silanol groups) and the number of bonds capable of being silanol groups and the like bonded to one silicon atom.

The ink repellent (A) comprises a curable silicone obtainable by hydrolytic condensation of at least three monomers, the three monomers respectively selected from the after-mentioned hydrolyzable silane compound (a-1), hydrolyzable silane compound (a-2) and hydrolyzable silane compound (a-3), and has a fluoroorganic group, an organic group having a (meth)acryloyl group and in some cases, a hydrocarbon group. Such an organic group means one having a bond of a carbon atom as the bond to be bonded to the silicon atom.

The hydrolyzable silane compound (a-1) is a trifunctional monomer having an organic group having one $C_{3-10}$ perfluoroalky group which may contain an etheric oxygen atom. Such hydrolyzable silane compounds (a-1) may be used alone or as a mixture of two or more in combination.

The hydrolyzable silane compound (a-2) is a (4-p)-functional monomer having p (wherein p is 0, 1 or 2) pieces of a hydrocarbon group(s). The hydrolyzable silane compound (a-2) is preferably a tetrafunctional monomer wherein p is 0 or a trifunctional monomer wherein p is 1, particularly preferably a tetrafunctional monomer. Such hydrolyzable silane compounds (a-2) may be used alone or as a mixture of two or more in combination. When two or more are used in combination, a bifunctional monomer may be used in combination with the tetrafunctional monomer and/or the trifunctional monomer.

The hydrolyzable silane compound (a-3) is a (4-q-r)-functional monomer having q (wherein q is 1 or 2) pieces of an organic group(s) having a polymerizable functional group selected from an acryloyl group and a methacryloyl group and r (wherein r is 0 or 1 and is a number to achieve q+r=1 or 2) piece of a hydrocarbon group. The hydrolyzable silane compound (a-3) is preferably a bifunctional monomer wherein q is 1 and r is 1, or a trifunctional monomer wherein q is 1 and r is 0. Such hydrolyzable silane compounds (a-3) may also be used alone or as a mixture of two or more in combination.

The hydrolyzable silane compounds (a-1) to (a-3) as starting material components to obtain the hydrolyzed condensate to be used in the present invention are represented by chemical formulae. The hydrolyzable silane compound (a-1) is a compound [hereinafter referred to as compound (a1)] represented by the following formula (a1), the hydrolyzable silane compound (a-2) is a compound [hereinafter referred to as compound (a2)] represented by the following formula (a2) and the hydrolyzable silane compound (a-3) is a compound [hereinafter referred to as compound (a3)] represented by the following formula (a3).

In the above formulae (a1) to (a3), the symbols are as follows:

$R^F$ is an organic group having a $C_{3-10}$ perfluoroalkyl group which may contain an etheric oxygen atom;

$R^H$ is a hydrocarbon group;

Q is an organic group having a polymerizable functional group selected from an acryloyl group and a methacryloyl group;

X is a hydrolyzable group; and

P is 0, 1 or 2, q is 1 or 2, and r is 0 or 1, provided that q+r is 1 or 2.

In the formula (a1), 3 pieces of X may be the same or different from one another. In the formula (a2), when p=2, 2 pieces of $R^H$ may be the same or different from each other, and 2 pieces of X may be the same or different from each other. In the same manner, when p=0, 4 pieces of X may be the same or different from one another, and when p=1, 3 pieces of X may be the same or different from one another. In the formula (a3), when q=2, 2 pieces of Q may be the same or different from each other, when q+r=1, 3 pieces of X may be the same or different from one another, and when q+r=2, 2 pieces of X may be the same or different from each other.

The hydrolyzed condensate may also be a co-condensate of a silicon type hydrolyzable monomer not classified into the above hydrolyzable silane compounds (a-1) to (a-3) with the hydrolyzable silane compounds (a-1) to (a-3).

The silicon type hydrolyzable monomer other than the hydrolyzable silane compounds (a-1) to (a-3) may, for example, be a monofunctional hydrolyzable silane compound having three hydrocarbon groups and one hydrolyzable group bonded to a silicon atom, an organodisiloxane capable of being a monofunctional siloxane unit such as hexamethyldisiloxane, a cyclic organopolysiloxane such as octamethylcyclotetrasiloxane, or a hydrolyzable silane compound having a functional group-containing organic group called a silane coupling agent (excluding the above hydrolyzable silane compounds (a-1) to (a-3)).

In a case where the silicon type hydrolyzable monomer not classified into the above hydrolyzable silane compounds (a-1) to (a-3) is used, it is particularly preferred to use a monofunctional hydrolyzable silane compound (a-4) or an organodisiloxane (a-5) which functions as a molecular weight modifier for the hydrolyzed condensate, in combination with the hydrolyzable silane compounds (a-1) to (a-3).

The monofunctional hydrolyzable silane compound (a-4) may be preferably a hydrolyzable silane compound [hereinafter referred to as compound (a-4)] represented by the following formula (a-4), and the organodisiloxane (a-5) may be preferably an organodisiloxane [hereinafter referred to as compound (a5)] represented by the following formula (a5). These are silane compounds capable of forming monofunctional siloxane units.

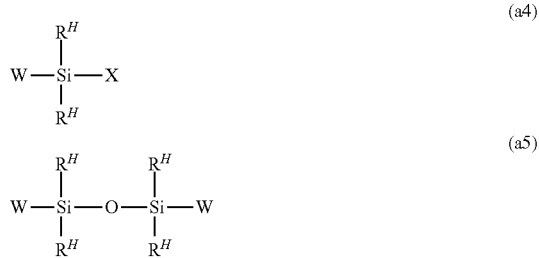

In the above formulae (a-4) and (a5), the symbols X and $R^H$ are the same as X and $R^H$ in the above formulae (a1) to (a3). In the formulae (a-4) and (a5), W independently represents the above $R^F$, $R^H$ or Q. In the formula (a5), the plurality of W may be the same or different from each other. In the formula (a-4), two pieces of $R^H$ (when W is $R^H$, three pieces of $R^H$) may be the same or different from each other, and in the formula (a5), four pieces of $R^H$ (when W is $R^H$, 5 or 6 pieces of $R^H$) may be the same or different from one another.

The group $R^F$ and the group $R^H$ in the repellent (A) to be used in the present invention are groups to exhibit water repellency, and the oil repellency is exhibited mainly by the group $R^E$. It is considered that a cured product of the ink repellent (A) exhibits sufficient oil repellency because of the presence of the group $R^F$ bonded to a silicon atom to which no group $R^H$ which impairs the oil repellency is bonded. Further, in order that a cured product of the ink repellent (A) may exhibit sufficient oil repellency, the relative proportion of the group $R^E$ is preferably high based on the total amount of the group $R^E$ and the group $R^H$ in the ink repellent (A). When p=0, there is such an advantage that the relative proportion of the group $R^F$ in the ink repellent (A) is high, thus leading to an improvement in the oil repellency and excellent film-forming property. When p=1 or 2, there is such an advantage that since the groups $R^H$ are present to a certain extent, the ink repellent (A) is easily soluble in a hydrocarbon solvent, and accordingly a relatively inexpensive solvent can be selected when a coating film of the photosensitive composition is formed on the surface of a substrate.

The ink repellent (A) may be cured by polymerization by light due to an organic group having a (meth)acryloyl group represented by Q. Further, the group Q improves the solubility in a hydrocarbon solvent similar to the group $R^H$. However, it will cause a decrease in the water repellency, and accordingly the relative proportion of the group Q based on the group $R^E$ is preferably not high more than necessary. In order to achieve such preferred conditions, it is necessary to adjust the structures, the combination, etc. of the hydrolyzable silane compounds (a-1) to (a-3) as starting material components for the ink repellent (A), and the monofunctional hydrolyzable silane compound (a-4) and the organodisiloxane (a-5) as optional starting material components, which will be described hereinafter.

In a case where the ink repellent (A) is obtained from the hydrolyzable silane compounds (a-1) to (a-3) and the monofunctional hydrolyzable silane compound (a-4) and the organodisiloxane (a-5) in combination, by using a monofunctional hydrolyzable silane compound (a-4) or an organodisiloxane (a5) wherein W is $R^F$, the relative proportion of the group $R^F$ in the ink repellent (A) is increased, thus leading to more excellent oil repellency, although it depends on the types and the amounts of the hydrolyzable silane compound (a-1) to (a-3). Further, by using compounds wherein W is $R^H$, the solubility of the ink repellent (A) in a hydrocarbon solvent will be improved. By using compounds wherein W is Q, the curability of the ink repellent (A) will be improved, and the solubility in a hydrocarbon solvent will be improved.

The ink repellent (A) is a reaction product obtainable by reacting the above respective compounds. This reaction is formation of a silanol group by hydrolytic reaction of a hydrolyzable group and formation of a siloxane bond by dehydration condensation of silanol groups.

The co-condensation ratio of the respective monomers i.e. the hydrolyzable silane compounds (a-1) to (a-3) used for preparation of the ink repellent (A) is not particularly limited, and the amount of the hydrolyzable silane compound (a-2) is preferably from 0.1 to 9 mol per 1 mol of the hydrolyzable silane compound (a-1). The amount of the compound (a-2) is more preferably from 0.5 to 9 mol per 1 mol of the compound (a-1). The ink repellent (A) contains the groups $R^F$ derived from the hydrolyzable silane compound (a-1), and the groups $R^F$ have a property to segregate on the surface of a coating film. Accordingly, by introducing a small amount of the groups $R^F$ (in other words, the compound (a-1)) to the ink repellent (A), a film obtained by curing the photosensitive composition will exhibit water repellency. If the groups $R^F$ (the compound (a-1)) are excessively introduced to the ink repellent (A), the solubility in a general purpose solvent may be impaired.

In preparation of the ink repellent (A), the amount of the hydrolyzable silane compound (a-3) is preferably from 0.01 to 10 mol, particularly preferably from 0.1 to 1 mol per 1 mol of the hydrolyzable silane compound (a-1). If the amount of the hydrolyzable silane compound (a-3) is too larger than the above preferred amount, the water repellency of the cured product may be decreased, and if the amount is too smaller than the above preferred range, no ink repellent (A) having sufficient curability may be obtained.

In preparation of the ink repellent (A), in a case where a silane compound capable of forming a monofunctional siloxane unit such as a monofunctional hydrolyzable silane compound (a-4) or an organodisiloxane (a-5) is used in addition to the hydrolyzable silane compounds (a-1) to (a-3), the amount of the monofunctional hydrolyzable silane compound (a-4) or the organodisiloxane (a-5) is preferably at most 100 mol %, particularly preferably at most 10 mol % based on the total number of mols of the hydrolyzable silane compounds (a-1) to (a-3). However, in a case where only the organodisiloxane (a-5) is used, the above amount is preferably at most 50 mol %, particularly preferably at most 5 mol %.

The ink repellent (A) in the present invention may be constituted by a single compound but is usually a mixture constituted by a plurality of compounds differing in the degree of polymerization, etc. The ink repellent (A) is one having a structure of an average compositional formula represented by the following formula (1). However, the ink repellent (A) is practically considered to be a product (partially hydrolyzed condensate) in which a hydrolyzable group or a silanol group remains, and such a product is hardly represented by a chemical formula, and the average compositional formula represented by the following formula (1) is a chemical formula assuming that all hydrolyzable groups or silanol groups are converted to siloxane bonds.

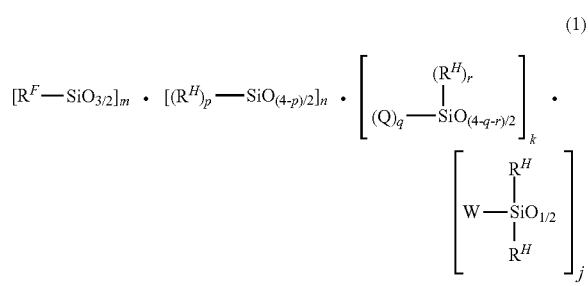

(1)

In the formula, $R^F$, $R^H$, Q, W, p, q and r are as defined in the above formulae (a1) to (a5), each of m, n and k is an integer of at least 1, and j is 0 or an integer of at least 1.

An ink repellent (A) obtainable by using the above compounds (a1) to (a3) as essential components and as the case requires, a compound (preferably the compound (a-4) and/or (a5)) other than the compounds (a1) to (a3), is a compound wherein each of m, n and k is an integer of at least 1, and j is 0 or an integer of at least 1. The monomer units derived from the respective compounds (a1) to (a5) are estimated to be randomly arranged. With respect to the values of m, n and k, m:n and m:k as average values in the entire ink repellent (A) are preferably such that the proportion of the amount of the hydrolyzable silane compound (a-2) to the hydrolyzable silane compound (a-1) and the proportion of the amount of the hydrolyzable silane compound (a-3) to the hydrolyzable silane compound (a-1) are within the above-described ranges. Further, with respect to the value of j, (m+n+k):j as an average value in the entire ink repellent (A) is preferably within the above-described range, that is, j is preferably at most 1, particularly preferably at most 0.1 based on the value of (m+n+k) of 1.

The number average molecular weight of the ink repellent (A) in the present invention is preferably at least 500, more preferably at least 1,000, and preferably less than 1,000,000, more preferably less than 10,000, especially preferably less than 5,000.

When the number average molecular weight is at least 500, there is such an advantage that evaporation from the substrate surface can be prevented, and when the number average molecular weight is less than 1,000,000, there is such an advantage that the solubility in a solvent will be good, thus improving the workability. The number average molecular weight of the ink repellent (A) can be adjusted by selecting the reaction conditions, etc. The upper limit of the molecular weight can be adjusted by using the monofunctional hydrolyzable silane compound (a-4) or the organodisiloxane (a-5). Further, by such a compound, the storage stability of the ink repellent (A) obtainable by a reaction can be improved. The number average molecular weight is a value measured by means of gel permeation chromatography using polystyrene as the standard substance. Hereinafter, the number average molecular weight disclosed in this specification is a value measured by this measurement method.

Now, the compounds (a1) to (a5) will be described in further detail with reference to specific examples.

X which the compounds (a1) to (a5) have is a hydrolyzable group, such as an organic group having a hydrogen atom of a hydroxy group removed from a monool, a halogen atom, an acyl group, an isocyanate group or an organic group having a hydrogen atom of an amino group removed from an amine compound. X is preferably an alkoxy group having at most 4 carbon atoms or a halogen atom, more preferably $CH_3O$—, $C_2H_5O$— or Cl—. Such a group (X) is converted to a hydroxy group (a silanol group) by a hydrolytic reaction, and further reacts intermolecularly to form a Si—O—Si bond.

$R^F$ which the compound (a1) has and which the compounds (a-4) and (a5) optionally have, is preferably a group represented by $R^{F1}$—Y—. Here, $R^{F1}$ is a $C_{3-10}$ perfluoroalkyl group which may contain an etheric oxygen atom, and Y is a bivalent connecting group containing no fluorine atom.

$R^{F1}$ is preferably a $C_{4-8}$ perfluoroalkyl group or a $C_{4-6}$ perfluoroalkyl group containing an etheric oxygen atom, more preferably a $C_5$ perfluoroalkyl group. When $R^{F1}$ is such a group, partition walls formed by using the negative photosensitive composition of the present invention have excellent ink repellency and ink repellency resistant to UV ozone, and are excellent in solubility in a general purpose solvent.

The structure of $R^{F1}$ may be a linear structure, a branched structure, a cyclic structure or a structure partially having a ring, and is preferably a linear structure in the present invention.

As specific examples of $R^{F1}$, the following groups may be mentioned.

$F(CF_2)_4$—, $F(CF_2)_6$—, $F(CF_2)_8$.
$CF_3CF_2OCF_2CF_2OCF_2$—,
$CF_3CF_2OCF_2CF_2OCF_2CF_2$—,
$CF_3CF_2OCF_2CF_2OCF_2CF_2OCF_2CF_2OCF_2$—,
$CF_3CF_2OCF_2CF_2OCF_2CF_2OCF_2CF_2OCF_2CF_2$—.
$CF_3CF_2CF_2OCF_2$—, $CF_3CF_2CF_2OCF_2CF_2$—,
$CF_3CF_2CF_2OCF(CF_3)$—, $CF_3CF_2CF_2OCF(CF_3)CF_2$—,
$CF_3CF_2CF_2OCF(CF_3)CF_2OCF_2CF_2$—, $CF_3CF_2CF_2OCF(CF_3)CF_2OCF(CF_3)$—, $CF_3CF_2CF_2OCF(CF_3)CF_2OCF(CF_3)CF_2$—.

The above Y is not particularly limited so long as it is a bivalent connecting group, and is preferably a group represented by —$(CH_2)_g$—, —$CH_2O(CH_2)_g$—, —$SO_2NR^2$—$(CH_2)_g$— or —(C=O)—$NR^2$—$(CH_2)_g$—, wherein g is an integer of from 1 to 5, and $R^2$ is a hydrogen atom, a methyl group or an ethyl group. Y is particularly preferably —$(CH_2)_g$— wherein g is 2 or 3. The direction of the group Y means that Si is bonded to the right side and $R^{F1}$ is bonded to the left side.

In a case where $R^{F1}$ is a $C_{4-8}$ perfluoroalkyl group, Y is preferably a group represented by —$(CH_2)_g$—. g is preferably an integer of from 2 to 4, and particularly preferred is —$(CH_2)_2$— wherein g is 2.

In a case where $R^{F1}$ is a $C_{4-9}$ perfluoroalkyl group containing an etheric oxygen atom, Y is preferably a group represented by —$(CH_2)_h$—, —$CH_2$—O—$(CH_2)_h$—, —$SO_2NR^2$—$(CH_2)_h$— or —(C=O)—$NR^2$—$(CH_2)_h$—, wherein h is an integer of from 1 to 5, and $R^2$ is a hydrogen atom, a methyl group or an ethyl group. Y is particularly preferably —$(CH_2)_2$— wherein h is 2. The direction of the bond of the group Y means that Si is bonded to the right side and $R^{F1}$ is bonded to the left side.

$R^H$ which the compounds (a2) to (a5) have is preferably a $C_{1-4}$ alkyl group or a phenyl group, more preferably a methyl group or an ethyl group, particularly preferably a methyl group.

Q which the compound (a3) has and the compounds (a-4) and (a5) optionally have, is preferably a group represented by $Q^1$-Z—, wherein $Q^1$ is a (meth)acryloyloxy group, and Z is —$(CH_2)_3$—, —$(CH_2)_4$—, —$(CH_2)_5$— or $(CH_2)_6$—, preferably —$(CH_2)_3$—.

As specific examples of the compound (a1), the following examples are preferred.

$F(CF_2)_4CH_2CH_2Si(OCH_3)_3$,
$F(CF_2)_6CH_2CH_2Si(OCH_3)_3$,
$F(CF_2)_8CH_2CH_2Si(OCH_3)_3$,
$CF_3CF_2CF_2OCF(CF_3)CF_2OCF_2CF_2CH_2CH_2Si(OCH_3)_3$.

As specific examples of the compound (a2), the following examples are preferred.

$Si(OCH_3)_4$, $Si(OCH_2CH_3)_4$, $CH_3Si(OCH_3)_3$,
$CH_3Si(OCH_2CH_3)_3$, $CH_3CH_2Si(OCH_3)_3$,
$CH_3CH_2Si(OCH_2CH_3)_3$, $(CH_3)_2Si(OCH_3)_2$,
$(CH_3)_2Si(OCH_2CH_3)_2$.

As specific examples of the compound (a3), the following examples are preferred.

$CH_2\!\!=\!\!C(CH_3)COO(CH_2)_3Si(OCH_3)_3$,
$CH_2\!\!=\!\!C(CH_3)COO(CH_2)_3Si(OCH_2CH_3)_3$,
$CH_2\!\!=\!\!CHCOO(CH_2)_3Si(OCH_3)_3$,
$CH_2\!\!=\!\!CHCOO(CH_2)_3Si(OCH_2CH_3)_3$,
$[CH_2\!\!=\!\!C(CH_3)COO(CH_2)_3]CH_3Si(OCH_3)_2$,
$[CH_2\!\!=\!\!C(CH_3)COO(CH_2)_3]CH_3Si(OCH_2CH_3)_2$.

As specific examples of the compound (a-4), the following examples are preferred.

$F(CF_2)_6CH_2CH_2(CH_3)_2Si(OCH_3)$, $(CH_3)_3Si(OCH_3)$,
$[CH_2\!\!=\!\!C(CH_3)COO(CH_2)_3](CH_3)_2Si(OCH_3)$.

As specific examples of the compound (a5), the following examples are preferred.

$(CH_3)_3SiOSi(CH_3)_3[CH_2\!\!=\!\!C(CH_3)COO(CH_2)_3](CH_3)_2SiOSi(CH_3)_2[(CH_2)_3OOC(CH_3)C\!\!=\!\!CH_2]$.

For the reaction of hydrolysis and condensation of the hydrolyzable silane compounds (a-1) to (a-3) and the monofunctional hydrolyzable silane compound (a-4) and the organodisiloxane (a-5) optionally added to obtain the ink repellent (A), reaction conditions to be usually employed for a common reaction of hydrolytic condensation of a hydrolyzable silane compound can be applied without any particular restriction, and it is preferred to use an inorganic acid such as hydrochloric acid, sulfuric acid or nitric acid as a catalyst. The amount of the catalyst to be used is specifically from 0.01 to 10 mass %, preferably from 0.1 to 1 mass % based on the total amount of the hydrolyzable silane compounds (a-1) to (a-3) to be used for the reaction and the monofunctional hydrolyzable silane compound (a-4) and the organodisiloxane (a-5) optionally added.

As a solvent to be used for the hydrolytic condensation reaction to obtain the ink repellent (A), it is preferred to combine a water soluble solvent in which the catalyst is dissolved with a solvent in which a product is dissolved, and it is preferred that the water soluble solvent and the solvent in which the product is dissolved are miscible with each other. As a combination of such solvents, specifically, isopropyl alcohol with hexane, isopropyl alcohol with dichloropentafluoropropane (AK-225 manufactured by Asahi Glass Company, Limited, a mixture of $CF_3CF_2CHCl_2$ and $CClF_2CF_2CHClF$), or isopropyl alcohol with toluene, may, for example, be mentioned.

The amount of the solvent to be used is specifically from 0.1 to 100 mass %, preferably from 1 to 10 mass % based on the total amount of the hydrolyzable silane compounds (a-1) to (a-3) to be used for the reaction and the monofunctional hydrolyzable silane compound (a-4) and the organodisiloxane (a-5) optionally added. The reaction is preferably carried out under proper stirring conditions at a temperature of from room temperature to the boiling point of the solvent. The reaction time specifically depends on the amounts of the starting material components used, the reaction temperature, the stirring conditions, etc. and is approximately from 0.5 to 24 hours, preferably from 1 to 10 hours. After the completion of the reaction, the solvent is removed by a conventional method to obtain the ink repellent (A).

The ink repellent (A) in the present invention has a fluorine atom content of from 10 to 55 mass %, preferably from 20 to 55 mass %, particularly preferably from 30 to 55 mass %, whereby partition walls obtainable from the negative photosensitive composition of the present invention are excellent in the ink repellency and the ink repellency resistant to the UV ozone. From the same reasons, in the ink repellent (A), it is preferred that the organic group which the hydrolyzable silane compound (a-1) has is an organic group having a $C_{4-8}$ perfluoroalkyl group or a $C_{4-9}$ perfluoroalkyl group containing an etheric oxygen atom, and has a fluorine atom content of from 20 to 55 mass %, most preferably from 40 to 55 mass %. Such a fluorine atom content is preferably at most 50 mass %, more preferably at most 45 mass %.

In this specification, the fluorine atom content is a value calculated from a chemical formula assuming that all hydrolyzable groups in the hydrolyzable silane compounds as starting materials are converted to siloxane bonds to constitute a hydrolyzed condensate.

The proportion of the ink repellent (A) which the negative photosensitive composition of the present invention contains is from 0.01 to 10 mass %, preferably from 0.1 to 1 mass % to the total solid content of the negative photosensitive composition. In this specification, the negative photosensitive composition is defined to contain substantially no solvent, and the total solid content of the negative photosensitive composition means all the components in the negative photosensitive composition of the present invention. By the proportion of the ink repellent (A) within such a range, partition walls for an optical device obtainable from the negative photosensitive composition of the present invention will have good ink repellency and have a smooth surface.

Now, the photosensitive resin (B) which the negative photosensitive composition of the present invention contains will be described below.

[Photosensitive Resin (B)]

The photosensitive resin (B) which the negative photosensitive composition of the present invention contains is a photosensitive resin having an acidic group and an ethylenic double bond in one molecule. By the photosensitive resin (B) having an acidic group, the non-exposed portion of a coating film of the negative photosensitive composition containing it will be removed by an alkali developer, and by it containing an ethylenic double bond, the exposed portion of a coating film of the negative photosensitive composition will not be removed by an alkali developer but will remain on the coating film, thus forming partition walls or the like for an optical device.

The photosensitive resin (B) preferably contains substantially no perfluoroalkyl group.

The acidic group may be at least one acidic group selected from the group consisting of a carboxy group, a phenolic hydroxy group, a sulfonic acid group and a phosphoric acid group.

integer of from 1 to 50, preferably from 2 to 10), or an epoxy resin represented by the following formula (B22) (wherein each of $R^7$, $R^8$, $R^9$ and $R^{10}$ which are independent of one another, is a hydrogen atom, a chlorine atom or a $C_{1-5}$ alkyl group, and they may be the same or different from one another, and t is an integer of from 0 to 10).

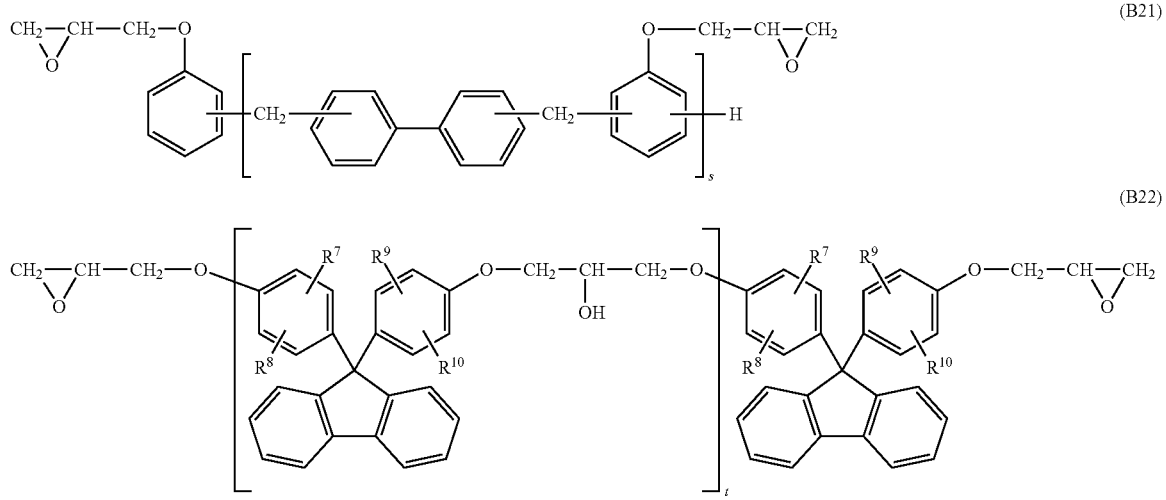

The ethylenic double bond may, for example, be an addition-polymerizable unsaturated group such as a (meth)acryloyl group, an allyl group, a vinyl group or a vinyl ether group, or a group having a part of or all the hydrogen atoms of such an addition-polymerizable unsaturated group substituted by a hydrocarbon group(s). The hydrocarbon group is preferably a methyl group.

The photosensitive resin (B) may, for example, be specifically a polymer (B1) having a side chain containing an acidic group and a side chain containing an ethylenic double bond, which is a copolymer of an ethylenically unsaturated monomer containing an acidic group, an ethylenically unsaturated monomer containing a functional group capable of being bonded to a reactive group, and the like, or a resin (B2) having an ethylenic double bond and an acidic group introduced to an epoxy resin.

The above polymer (B1) may be obtained, for example, by preparing an ethylenically unsaturated monomer containing an acidic group, an ethylenically unsaturated monomer containing a functional group capable of being bonded to a reactive group, and the like by a conventional radical polymerization method, and reacting a compound containing a reactive group and a double bond to form a side chain having an ethylenic double bond.

The resin (B2) is preferably a compound obtained by reacting a reaction product of an epoxy resin with a compound containing a carboxy group and an ethylenic double bond, with a polybasic carboxylic acid or its anhydride.

The epoxy resin to be used for preparation of the resin (B2) may, for example, be specifically a bisphenol A type epoxy resin, a bisphenol F type epoxy resin, a phenol novolac type epoxy resin, a cresol novolac type epoxy resin, a trisphenol methane type epoxy resin, an epoxy resin having a naphthalene skeleton, an epoxy resin having a biphenyl skeleton represented by the following formula (B21) (wherein s is an An ethylenic double bond is introduced to an epoxy resin by reacting a compound containing a carboxy group and an ethylenic double bond with the epoxy resin. Further, by reacting a polybasic carboxylic acid or its anhydride therewith, it is possible to introduce a carboxy group as an acidic group.

Commercial products of the resin (B2) having an acidic group and an ethylenic double bond introduced to the epoxy resin may, for example, be KAYARAD PCR-1069, K-48C, CCR-1105, CCR-1115, CCR-1163H, CCR-1166H, CCR-1159H, TCR-1025, TCR-1064H, TCR-1286H, ZAR-1535H, ZFR-1122H, ZFR-1124H, ZFR-1185H, ZFR-1492H, ZCR-1571H, ZCR1569H, ZCR-1580H, ZCR1581H and ZCR1588H (all manufactured by Nippon Kayaku Co., Ltd.).

In the negative photosensitive composition of the present invention, the photosensitive resin (B) preferably has at least three ethylenic double bonds in one molecule, preferably at least 6 ethylenic double bonds in one molecule. It is thereby possible that the difference in alkali solubility may readily be made between an exposed portion and a non-exposed portion of a coating film of the obtainable negative photosensitive composition, and it becomes possible to form a fine pattern with less light exposure.

The photosensitive resin (B) preferably has a carboxy group and/or a hydroxy group as a crosslinkable group. The negative photosensitive composition of the present invention contains a heat crosslinking agent (E) which is a compound having at least two groups reactive with a carboxy group and/or a hydroxy group in some cases as described hereinafter. In such a case, when the photosensitive resin (B) contains a carboxy group and/or a hydroxy group as a crosslinkable group, the photosensitive resin (B) and the heat crosslinking agent (E) will undergo a crosslinking reaction by heat treatment after the development, whereby the crosslinked density of a coating film cured product will be increased, and the heat resistance will be improved. When the photosensitive resin (B) already has at least one group selected from a carboxy group and a phenolic hydroxy group as an acidic group, such a group may function as the crosslinkable group. In a case where the photosensitive resin (B) has a sulfonic acid group, a phosphoric acid group or the like as the acidic group, it preferably has at least one group selected from a carboxy group, a phenolic hydroxy group and an alcoholic hydroxy group as the crosslinkable group.

The acid value of the photosensitive resin (B) is preferably from 10 to 300 mgKOH/g, more preferably from 30 to 150 mgKOH/g. Within such a range, the developability of the obtainable negative photosensitive composition will be good. Further, the acid value means milligram of potassium hydroxide required to neutralize e.g. the resin acid in 1 g of a sample, and is a value measured in accordance with a measuring method.

The number average molecular weight of the photosensitive resin (B) is preferably at least 500 and less than 20,000, more preferably at least 2,000 and less than 15,000. Within such a range, the alkali solubility and the developability of the obtainable negative photosensitive composition will be good.

The negative photosensitive composition of the present invention may contain, as the photosensitive resin (B), one of compounds classified therein alone or may contain a mixture of two or more. Further, the proportion of the photosensitive resin (B) to the total solid content of the negative photosensitive composition of the present invention is preferably from 5 to 80 mass %, more preferably from 10 to 60 mass %. Within such a range, the developability of the negative photosensitive composition will be good.

Now, the photopolymerization initiator (C) which the negative photosensitive composition of the present invention contains will be described.

[Photopolymerization Initiator (C)]

The photopolymerization initiator (C) which the negative photosensitive composition of the present invention contains is not particularly limited so long as it is a compound having a function as a photopolymerization initiator, and is preferably a compound which generates radicals by light.

The photopolymerization initiator (C) may, for example, be an α-diketone such as benzyl, diacetyl, methylphenylglyoxylate or 9,10-phenanthrenequinone; an acyloin such as benzoin; an acyloin ether such as benzoin methyl ether, benzoin ethyl ether or benzoin isopropyl ether; a thioxanthone such as thioxanthone, 2-chlorothioxanthone, 2-methylthioxanthone, 2,4-dimethylthioxanthone, isopropylthioxanthone, 2,4-diethylthioxanthone, 2,4-dichlorothioxanthone, 2,4-diisopropylthioxanthone or thioxanthone-4-sulfonic acid; a benzophenone such as benzophenone, 4,4'-bis(dimethylamino)benzophenone or 4,4'-bis(diethylamino)benzophenone; an acetophenone such as acetophenone, 2-(4-toluenesulfonyloxy)-2-phenylacetophenone, p-dimethylaminoacetophenone, 2,2'-dimethoxy-2-phenylacetophenone, p-methoxyacetophenone, 2-methyl-[4-(methylthio)phenyl]-2-morpholino-1-propanone, or 2-benzyl-2-dimethylamino-1-(4-morpholinophenyl)-butan-1-one; a quinone such as anthraquinone, 2-ethylanthraquinone, camphorquinone or 1,4-naphthoquinone; an aminobenzoate such as ethyl 2-dimethylaminobenzoate, ethyl 4-dimethylaminobenzoate, (n-butoxy)ethyl 4-dimethylaminobenzoate, isoamyl 4-dimethylaminobenzoate or 2-ethylhexyl 4-dimethylaminobenzoate; a halogenated compound such as phenacyl chloride or trihalomethyl phenyl sulfone; an acylphosphine oxide; a peroxide such as di-t-butylperoxide; or an oxime ester such as 1,2-octanedione, 1-[4-(phenylthio)-, 2-(o-benzoyloxime) or ethanone 1-[9-ethyl-6-(2-methylbenzoyl)-9H-carbazoyl-3-yl]-1-(o-acetyloxime).

Particularly, the above-mentioned benzophenone, aminobenzoate or the like may be used together with a radical initiator to exhibit a sensitizing effect. Further, an aliphatic amine such as triethanolamine, methyldiethanolamine, triisopropanolamine, n-butylamine, N-methyldiethanolamine or diethylaminoethyl methacrylate may likewise be used together with a radical initiator to exhibit a sensitizing effect.

Further, in addition to the above, a thiol compound such as 2-mercaptobenzimidazole, 2-mercaptobenzoxazole, 2-mercaptobenzothiazole, 1,4-butanolbis(3-mercaptobutyrate), tris(2-mercaptopropanoyloxyethyl)isocyanurate or pentaerythritol tetrakis(3-mercaptobutyrate) may also be used together with the radical initiator to exhibit a synthesizing effect.

The negative photosensitive composition of the present invention may contain, as the photopolymerization initiator (C), one of compounds classified therein alone or may contain a mixture of two or more. Further, the proportion of the photopolymerization initiator (C) to the total solid content of the negative photosensitive composition of the present invention is preferably from 0.1 to 50 mass %, more preferably from 0.5 to 30 mass %. Within such a range, the developability of the obtainable negative photosensitive composition will be good.

The ink repellent (A), the photosensitive resin (B) and the photopolymerization initiator (C) which the negative photosensitive composition of the present invention contains as essential components were described above. However, the negative photosensitive composition of the present invention may contain various optional components in addition to these essential components. Now, optional components which the negative photosensitive composition of the present invention may contain will be described.

[Optional Components]

It is preferred that the negative photosensitive composition of the present invention further contains a radical crosslinking agent (D) having at least two ethylenic double bonds and having no acidic group, whereby the photocurability of the negative photosensitive composition further improves, and the formation of partition walls for an optical device with low exposure is accelerated.

As specific examples of the radical crosslinking agent (D), diethylene glycol di(meth)acrylate, tetraethylene glycol di(meth)acrylate, tripropylene glycol di(meth)acrylate, neopentyl glycol di(meth)acrylate, 1,9-nonanediol di(meth)acrylate, trimethylolpropane tri(meth)acrylate, pentaerythritol tri(meth)acrylate, pentaerythritol tetra(meth)acrylate, ditrimethylolpropane tetra(meth)acrylate dipentaerythritol penta(meth)acrylate or dipentaerythritol hexa(meth)acrylate may be mentioned. Further, urethane acrylate may also be mentioned. They may be used alone, or two or more of them may be used in combination.

In the negative photosensitive composition of the present invention, the proportion of the radical crosslinking agent (D) to the total solid content of the negative photosensitive composition is preferably from 10 to 60 mass %, more preferably from 15 to 50 mass %. Within such a range, the developability of the obtainable negative photosensitive composition will be good.

It is preferred that the negative photosensitive composition of the present invention further contains a heat crosslinking agent (E) which is a compound having at least two groups reactive with a carboxy group and/or a hydroxy group. In a case where the photosensitive resin (B) has a carboxy group and/or a hydroxy group, the heat crosslinking agent (E) has a function to be reacted with the photosensitive resin (B), thus increasing the crosslinked density of the coating film cured product and improving the heat resistance.

The heat crosslinking agent (E) may be preferably at least one member selected from the group consisting of an amino resin, an epoxy compound, an oxazoline compound, a polyisocyanate compound and a polycarbodiimide compound. Such a compound may be used alone, or two or more of them may be used in combination.

The proportion of the heat crosslinking agent (E) to the total solid content of the negative photosensitive composition of the present invention is preferably from 1 to 50 mass %, more preferably from 5 to 30 mass %. Within such a range, the developability of the obtainable negative photosensitive composition will be good.

In a case where the negative photosensitive composition of the present invention is used for formation of a black matrix which is a black portion in a lattice form surrounding three color pixels of R, G and B in a color filer of a liquid crystal display device, it preferably contains a black colorant (F). The black colorant may, for example, be specifically carbon black, aniline black, anthraquinone black pigment or perylene black pigment, specifically, C. I. Pigment Black 1, 6, 7, 12, 20 or 31. As the black colorant (F), it is also possible to use a mixture of organic or inorganic pigments of e.g. red, blue and green pigments. As the black colorant (F), carbon black is preferred from the viewpoint of the price and good shielding property. Such carbon black may be surface-treated with e.g. a resin. Further, in order to adjust the color tone, a blue pigment or a purple pigment may be used in combination.

The carbon black is preferably one having a specific surface area of from 50 to 200 $m^2/g$, more preferably from 60 to 180 $m^2/g$ as measured by BET method, from the viewpoint of the black matrix shape. If carbon black having a specific surface area of less than 50 $m^2/g$ is used, deterioration of the black matrix shape is likely to result, and if carbon black having a specific surface area exceeding 200 $m^2/g$ is used, a dispersing aid is likely to be excessively adsorbed on the carbon black, whereby it will be required to incorporate a large amount of a dispersing agent in order to obtain various physical properties.

Further, the carbon black is preferably one having dibutyl phthalate oil absorption of at most 120 $cm^3/100$ g from the viewpoint of the sensitivity. The smaller the oil absorption, the better.

Further, the average primary particle size of carbon black is preferably from 20 to 50 nm as observed by a transmission electron microscope. If the average primary particle size is too small, it tends to be difficult to disperse it at a high concentration and to obtain a negative photosensitive composition having good stability with time. If the average primary particle size is too large, deterioration of the black matrix shape is likely to result. Further, the secondary particle size is preferably from 80 to 200 nm as observed by a transmission electron microscope.

In a case where the black colorant (F) is incorporated in the negative photosensitive composition of the present invention to use the composition for e.g. formation of a black matrix, the proportion of the black colorant (F) to the total solid content of the negative photosensitive composition is preferably from 1 to 50 mass %, more preferably from 20 to 40 mass %. Within such a range, the obtainable negative photosensitive composition will have good sensitivity, and partition walls to be formed are excellent in the light shielding properties.

It is preferred that the negative photosensitive composition of the present invention contains a silane coupling agent (G) as the case requires. In the case of using a silane coupling agent, the adhesion to the substrate of a coating film cured product formed from the obtainable negative photosensitive composition is improved.

The silane coupling agent (G) may, for example, be specifically tetraethoxysilane, 3-glycidoxypropyl trimethoxysilane, methyltrimethoxysilane, vinyltrimethoxysilane, 3-methacryloxypropyltrimethoxysilane, 3-chloropropyltrimethoxysilane, 3-mercaptopropyltrimethoxysilane, 3-aminopropyltriethoxysilane, heptadecafluorooctylethyltrimethoxysilane, or a polyoxyalkylene chain-containing triethoxysilane. They may be used alone or two or more of them may be used in combination.

In the negative photosensitive composition of the present invention, the proportion of the silane coupling agent (G) is preferably from 0.1 to 20 mass %, more preferably from 1 to 10 mass % to the total solid content. If the content is too low, the effect of improving the adhesion to the substrate of a coating film cured product formed from the obtainable negative photosensitive composition will be low, and if the content is too high, the ink repellency may be impaired.

To the negative photosensitive composition of the present invention, a curing accelerator, a thickener, a plasticizer, a defoaming agent, a leveling agent, an anti-repellent, an ultraviolet absorber, etc. may be incorporated, as the case requires.

In the present invention, the negative photosensitive composition is preferably applied on a substrate as mixed with a solvent. In this specification, the solvent is one which is not reactive.

The solvent may, for example, be specifically an alcohol such as ethanol, 1-propanol, 2-propanol, 1-butanol or ethylene glycol; a ketone such as acetone, methyl isobutyl ketone or cyclohexanone; a cellosolve such as 2-methoxyethanol, 2-ethoxyethanol or 2-butoxyethanol; a carbitol such as 2-(2-methoxyethoxy)ethanol, 2-(2-ethoxyethoxy)ethanol or 2-(2-butoxyethoxy)ethanol; an ester such as methyl acetate, ethyl acetate, n-butyl acetate, ethyl lactate, n-butyl lactate, ethylene glycol monomethyl ether acetate, ethylene glycol monoethyl ether acetate, ethylene glycol monobutyl ether acetate, diethylene glycol monomethyl ether acetate, diethylene glycol monoethyl ether acetate, diethylene glycol monobutyl ether acetate, propylene glycol momomethyl ether acetate, ethylene glycol diacetate, propylene glycol diacetate, ethyl-3-ethoxypropionate, cyclohexanol acetate, butyl lactate, γ-butyrolactone, 3-methyl-3-methoxybutyl acetate or glycerol triacetate; or diethylene glycol dimethyl ether, diethylene glycol diethyl ether, diethylene glycol dibutyl ether, triethylene glycol dimethyl ether, tetraethylene glycol dimethyl ether, propylene glycol dimethyl ether, dibutyl ether or diethylene glycol methylethyl ether. In addition, a chain hydrocarbon such as n-butane or n-hexane; a cyclic saturated hydrocarbon such as cyclohexane; or an aromatic hydrocarbon such as toluene, xylene or benzyl alcohol may, for example, be mentioned. They may be used alone or as a mixture of two or more in combination.

The amount of the solvent to be added to the negative photosensitive composition of the present invention is preferably from 1 to 100 mass % to the total solid content, although it depends on the composition, the application, etc. of the negative photosensitive composition.

The negative photosensitive composition of the present invention can be prepared in such a manner that the ink repellent (A) is weighed so that its proportion will be from 0.01 to 10 mass % to the total solid content in the negative photosensitive composition and the other components are weighed in the above-described appropriate amounts, and they are mixed and stirred by an appropriate method for an appropriate time, specifically from about 30 to about 120 minutes. Although it is possible to apply the obtained negative photosensitive composition as it is on a substrate to form a coating film, as described above, it is preferred that a solvent is added and a coating liquid containing it is employed to form a coating film. The solvent may be added to the obtained negative photosensitive composition, but it is preferred to add the solvent to the starting material components and to mix and stir the solvent together with the starting material components, when the starting material components for the negative photosensitive composition are mixed and stirred in the above preparation.

The negative photosensitive composition of the present invention is used as a material for photolithography etc. in the same manner as a conventional negative photosensitive composition, and an obtainable coating film cured product can be used as a member for an optical device for which a coating film cured product of a conventional negative photosensitive composition is employed. Particularly, it is preferred to use the negative photosensitive composition of the present invention for formation of partition walls for an optical device comprising a support substrate, and a plurality of pixels and partition walls located between the adjacent pixels, formed on the support substrate, whereby partition walls having sufficient ink repellency even after an ink affinity-imparting treatment such as UV ozone cleaning can be obtained.

The present invention further provides a process for producing such partition walls for an optical device using the negative photosensitive composition of the present invention. Now, the process for producing partition walls for an optical device of the present invention by photolithography using the negative photosensitive composition of the present invention will be described.

<Process for Producing Partition Walls for Optical Device Using Negative Photosensitive Composition of the Present Invention>

The process for producing partition walls for an optical device of the present invention is applied to production of partition walls for an optical device comprising a support substrate, and a plurality of pixels and partition walls located between the adjacent pixels formed on the support substrate, and comprises a step of applying the negative photosensitive composition of the present invention on the support substrate to form a coating film, a prebaking step of heating the coating film, an exposure step of exposing only a portion to be the partition walls of the coating film for photo-curing, a development step of removing the coating film other than the photo-cured portion to form partition walls made of the photo-cured portion of the coating film, and a post-baking step of heating the formed partition walls in this order.

In this specification, "applying the negative photosensitive composition of the present invention on the support substrate" means not only applying the negative photosensitive composition of the present invention as it is, but also applying, for example, a coating liquid containing the negative photosensitive composition having a solvent added to the negative photosensitive composition. Further, with respect to the "coating film" in and prior to the prebaking step, the "coating film made of the negative photosensitive composition" includes a coating film made of the above coating liquid.

FIG. 1 is a drawing schematically illustrating one embodiment of the production process of the present invention. FIG. 1(I) is a drawing illustrating a cross section of a state where a coating film 2 made of the negative photosensitive composition of the present invention is formed on a support substrate 1. FIG. 1(II) is a drawing schematically illustrating the exposure step. FIG. 1(III) is a cross-sectional view illustrating the support substrate 1 after the development step and partition walls 6 formed on the support substrate. Now, the production process of the present invention will be specifically described with reference to FIG. 1.

(Coating Film Formation Step)

To form partition walls for an optical device, first, as the cross section is shown in FIG. 1(I), the negative photosensitive composition of the present invention is applied on a support substrate 1 to form a coating film 2 made of the negative photosensitive composition. As the support substrate 1, its material is not particularly limited and may, for example, be various glass sheets; a thermoplastic sheet such as polyester (such as polyethylene terephthalate), polyolefin (such as polyethylene or polypropylene), polycarbonate, polymethyl methacrylate, polysulfone, polyimide or a poly(meth)acrylic resin; or a cured sheet of a thermosetting resin such as an epoxy resin or an unsaturated polyester. Particularly from the viewpoint of the heat resistance, a glass sheet or a heat resistant plastic such as polyimide is preferably employed. Before formation of the coating film 2 of the negative photosensitive composition on the support substrate 1, it is preferred to clean the surface of the support substrate 1 on which the negative photosensitive composition is applied, by alcohol cleaning, UV ozone cleaning or the like.

The method of forming the coating film 2 of the negative photosensitive composition is not particularly limited so long as a coating film having a uniform thickness can be formed, and may be a method employed for conventional formation of a coating film, such as a spin coating method, a spraying method, a slit coating method, a roll coating method, a rotary coating method or a bar coating method. The thickness of the coating film 2 is decided considering the height of the partition walls to be finally obtained. The film thickness is approximately preferably from 0.3 to 325 µm, more preferably from about 1.3 to about 65 µm.

(Prebaking Step)

Then, the coating film 2 formed on the support substrate 1 in the above coating film formation step is heated. By this heating, the volatile component contained in the negative photosensitive composition constituting the coating film, or a solvent added to the negative photosensitive composition as the case requires, is volatilized to obtain a non-adhesive coating film. Further, the ink repellent (A) migrates to the vicinity of the surface of the coating film. The heating method may be a method of subjecting the coating film 2 together with the support substrate 1 to heat treatment by a heating apparatus such as a hot plate or an oven preferably at from 50 to 120° C. preferably from 80 to 100° C. for from about 10 to about 2,000 seconds.

In a case where a coating liquid having a solvent added to the negative photosensitive composition is used in the above coating film formation step, removal of the solvent is necessary. It is possible to remove the solvent by heating in the prebaking step as described above, or a drying step other than heating (drying), such as vacuum drying, for removal of the solvent, may separately be carried out prior to the prebaking step. Further, it is more preferred to employ heating which also serves as drying in the above prebaking step and vacuum drying in combination, for efficient drying without non-uniformity in the outer appearance of the coating film. The conditions for vacuum drying vary depending on the types of the respective components, the blend proportions, etc., but preferably within wide ranges of from 500 to 10 Pa (gauge pressure) for from about 10 to about 300 seconds.

(Exposure Step)

After the prebaking step, an exposure step as shown in FIG. 1(II) is carried out. That is, the coating film 2 of the negative photosensitive composition after dried on the support substrate 1 is irradiated with light 5 via a mask 4 having a predetermined pattern. The light 5 is transmitted only through a predetermined pattern portion cut in the mask 4 and reaches the coating film of the negative photosensitive composition on the support substrate 1, and only that portion is photocured. Accordingly, for formation of partition walls, the above predetermined pattern is formed into a shape to fit the shape of the partition walls.

For example, it is preferred in the present invention to employ a mask having a pattern formed so that after the post-baking step described hereinafter, the average width of the partition walls is preferably at most 100 μm, more preferably at most 20 μm and the average distance between the adjacent partition walls is preferably at most 300 μm, more preferably at most 100 μm.

Exposure is a step of irradiating the desired portion of the coating film with light and its method is not particularly limited, and it is preferably carried out via a mask having a predetermined pattern as shown in FIG. 1(II). In FIG. 1(II), the exposed portion 3 of the coating film irradiated with light is made of a coating film cured product of the negative photosensitive composition, whereas the non-exposed portion is a state where the coating film 2 of the uncured negative photosensitive composition itself remains.

The light to be applied may, for example, be specifically visible light; ultraviolet rays; far ultraviolet rays; an excimer laser such as KrF excimer laser, ArF excimer laser, $F_2$ excimer laser, $Kr_2$ excimer laser, KrAr excimer laser or $Ar_2$ excimer laser; X-rays; or electron beams. Further, the light 5 to be applied is preferably electromagnetic waves having a wavelength of from 100 to 600 nm, more preferably light having a distribution in a range of from 300 to 500 nm, particularly preferably i-line (365 nm), h-line (405 nm) or g-line (436 nm).

As an irradiation apparatus (not shown), a known ultrahigh pressure mercury lamp or a deep UV lamp may, for example, be used. The light exposure is preferably from 5 to 1,000 mJ/cm$^2$, more preferably from 50 to 400 mJ/cm$^2$. If the light exposure is too low, curing of the negative photosensitive composition to be the partition walls will be inadequate, and in the subsequent development, dissolution or peeling from the support substrate 1 may occur. If the light exposure is too high, it tends to be difficult to obtain a high resolution. Further, the light irradiation (exposure) time depends on the light exposure, the composition of the negative photosensitive composition, the thickness of the coating film, etc., and is specifically from 1 to 60 seconds, preferably from 5 to 20 seconds.

(Development Step)

After the exposure step, development is carried out by a developer to remove the non-exposed portion 2 on the support substrate 1 shown in FIG. 1(II), whereby a structure of the support substrate 1 and partition walls 6 made of a coating film cured product of the negative photosensitive composition formed on the support substrate, as shown in the cross section shown in FIG. 1(III), is obtained. Further, the regions surrounded by the partition walls 6 and the support substrate 1 are regions called dots 7 within which pixels are formed e.g. by ink injection. The obtained substrate 10 becomes a substrate which can be used for preparation of an optical device by an ink jet method, by means of the after-mentioned post-baking step.

The developer to be used for development may, for example, be an aqueous alkali solution containing an alkali such as an inorganic alkali, an amine, an alcohol amine or a quaternary ammonium salt.

Further, to the developer, a surfactant or an organic solvent such as an alcohol may be added to improve the solubility and to remove the residue.

The development time (time during which the coating film is in contact with the developer) is preferably from 5 to 180 seconds. Further, the developing method may be any method such as a paddle method, a dipping method or a shower method. After the development, high pressure washing with water or washing with running water is carried out, followed by drying with compressed air or compressed nitrogen to remove moisture on the support substrate 1 and the partition walls 6.

(Post-Baking Step)

Then, it is preferred to heat the partition walls 6 on the support substrate 1. The heating method may be a method of subjecting the partition walls 6 together with the support substrate 1 to heat treatment by a heating device such as a hot plate or an oven preferably at from 150 to 250° C. for from 5 to 90 minutes. By this heat treatment, the partition walls 6 made of a coating film cured product of the negative photosensitive composition on the support substrate 1 will be further cured, and the shape of the dots 7 surrounded by the partition walls 6 and the support substrate 1 will be more fixed. The heating temperature is more preferably at least 180° C. If the heating temperature is too low, curing of the partition walls tends to be inadequate, whereby no sufficient chemical resistance will be obtained, and accordingly, in a case where an ink is injected into the dots 7 in the following ink jet coating step, the partition walls 6 may be swelled by a solvent contained in the ink, or the ink may bleed. On the other hand, if the heating temperature is too high, heat decomposition of the partition walls may occur.

It is possible to use the negative photosensitive composition of the present invention for pattern formation having a width of partition walls of preferably at most 100 μm, more preferably at most 20 μm on the average. Further, it is possible to use it for pattern formation having a distance (width of a dot) between adjacent partition walls of preferably at most 300 μm, more preferably at most 100 μm on the average. Further, it is possible to use it for pattern formation having a height of partition walls of preferably from 0.05 to 50 μm, more preferably from 2 to 10 μm on the average.

The present invention further provides a process for producing an optical device comprising a support substrate, and a plurality of pixels and partition walls (partition walls to be produced by the above process of the present invention) located between the adjacent pixels, formed on the support substrate. Now, the process for producing an optical device of the present invention will be described below.

<Process for Producing Optical Device of the Present Invention>

The process for producing an optical device of the present invention is applicable to production of an optical device comprising a support substrate, and a plurality of pixels and partition walls located between the adjacent pixels formed on the support substrate. That is, it comprises forming partition walls on a support substrate by the above production process of the present invention, applying an ink affinity-imparting treatment to the surface of the support substrate exposed to regions surrounded by the support substrate and the partition walls, and injecting an ink into the regions by an ink jet method to form the pixels.

(Ink Affinity-Imparting Treatment)

In the process for producing an optical device of the present invention, after formation of the partition walls by the above process of the present invention, an ink affinity-imparting treatment is applied to the surface of the support substrate exposed to the regions (dots) surrounded by the support substrate and the partition walls. The method of the ink affinity-imparting treatment may, for example, be cleaning with an aqueous alkali solution, UV cleaning, UV ozone cleaning, excimer cleaning, corona discharge treatment or oxygen plasma treatment. The cleaning with an aqueous alkali solution is a wet treatment of cleaning the surface of the support substrate with an aqueous alkali solution (e.g. a potassium hydroxide or tetramethylammonium hydroxide aqueous solution). The UV cleaning is a dry treatment of cleaning the surface of the support substrate by means of UV (ultraviolet rays). The UV ozone treatment is a dry treatment of cleaning the surface of the support substrate by means of a low pressure mercury lamp which emits light at 185 nm and 254 nm. The excimer cleaning is a dry treatment of cleaning the surface of the support substrate by means of a xenon excimer lamp which emits light at 172 nm. The corona discharge treatment is a dry treatment of cleaning the surface of the support substrate utilizing high frequency high voltage to generate corona discharge in the air. The oxygen plasma treatment is a dry treatment of cleaning the surface of the support substrate by exciting oxygen using e.g. a high frequency power source as a trigger mainly in vacuum to bring oxygen in a highly reactive "plasma state".

A dry treatment method such as the UV ozone cleaning is simple in the process and is preferred in the present invention. UV ozone may be generated by a commercially available apparatus. The ink affinity-imparting treatment can be conducted by placing the support substrate on which the partition walls are formed in a UV ozone apparatus and carrying out the treatment in the air atmosphere at room temperature for from about 1 to about 10 minutes within a range not to impair the oil repellency of the partition walls. The treatment time is adjusted so that the oil repellency of the partition walls are not impaired, in accordance with the individual UV ozone apparatus.

By this ink affinity-imparting treatment, removal of impurities remaining in the dots after formation of the partition walls, etc., can be sufficiently carried out, whereby ink affinity can be sufficiently imparted to the dots, and accordingly edge leakage of e.g. a color display device employing the obtainable optical device can be prevented. Further, by using partition walls obtainable from the negative photosensitive composition of the present invention, it is possible to carry out the ink affinity-imparting treatment without decreasing the ink repellency of the partition walls, e.g. by the UV cleaning.

The water-and-oil repellency (ink repellency) of a coating film cured product formed from the photosensitive composition can be estimated by the contact angle to water and PGMEA (propylene glycol monomethyl ether acetate, an organic solvent frequently used as a solvent for an ink). With respect to the optical device produced by the production process of the present invention, the partition walls are required to have sufficient ink repellency even after the ink affinity-imparting treatment. Thus, the contact angle of the partition walls to water is preferably at least 90°, more preferably at least 95°. Further, in the same manner, the contact angle of the partition walls to PGMEA is preferably at least 40°, more preferably at least 50°. Further, the dots in an optical device produced by the production process of the present invention are required to have affinity with an ink, and their contact angle to water is preferably at most 20°, more preferably at most 10°.

(Ink Injection Step)

This is a step of injecting an ink by an ink jet method within the dots after the step of ink affinity-imparting treatment to form pixels. This step can be carried out in the same manner as the conventional method by using an ink jet apparatus commonly used for an ink jet method. Such an ink jet apparatus used for formation of pixels is not particularly limited, and it is possible to use an ink jet apparatus employing various methods, such as a method of continuously jetting an electrified ink and controlling it by a magnetic field, a method of periodically spraying an ink by using piezoelectric elements, a method of heating an ink and intermittently jetting it by utilizing its foaming.

In this specification, the "ink" generically means a liquid having an optical or electrical function for example after dried and cured, and is not limited to conventionally employed coloring materials. Further, the same applies to the wording "pixels" formed by injecting the ink, and means compartments partitioned by the partition walls each having an optical or electrical function.

The optical device to which the process for producing an optical device of the present invention employing the partition walls of the present invention is preferably applied, may, for example, be specifically a color filter, an organic EL display device or an organic TFT array. Now, the application of the production process of the present invention to the above three types of optical devices will be described.

[Production of Color Filter]

In the case of producing a color filter employing the partition walls of the present invention, partition walls are formed by the above photolithography, the ink affinity-imparting treatment is carried out to the dots, and an ink is injected within the dots by an ink jet method to form pixels, thereby to produce a color filter.

Formation of the partition walls, the ink affinity-imparting treatment to the dots, and the ink injection by an ink jet method are as described above. In the color filter, the shape of the pixels to be formed may be any known configuration such as a stripe type, a mosaic type, a triangle type or a 4-pixel configuration type.

The ink to be used for forming pixels mainly comprises a coloring component, a binder resin component and a solvent. As the coloring component, it is preferred to employ a pigment or dye excellent in the heat resistance, light resistance, etc. As the binder resin component, a transparent resin excellent in the heat resistance is preferred, such as an acrylic resin, a melamine resin or an urethane resin. A water-base ink comprises, as the solvent, water and, if necessary, a water-soluble organic solvent, and as the binder resin component, a water-soluble resin or a water-dispersible resin, and it contains various additives as the case requires. Whereas, an oil-base ink comprises an organic solvent as the solvent and a resin soluble in the organic solvent as the binder resin component, and it contains various additives as the case requires.

Further, after injecting an ink by an ink jet method, if required, it is preferred to carry out drying, heat-curing or ultraviolet ray-curing.

After forming pixels, an overcoat layer may be formed as the case requires. Such an overcoat layer is formed preferably for the purpose of improving the surface flatness and for the purpose of preventing an eluent from the ink at partition walls or pixels from reaching the liquid crystal layer. In a case where such an overcoat layer is to be formed, it is preferred to preliminarily remove the ink repellency of the partition walls. In a case where the ink repellency is not removed, the overcoating liquid will be repelled, and a uniform film thickness tends to be hardly obtainable, such being undesirable. The method for removing the liquid repellency of the partition walls may, for example, be plasma ashing treatment or optical ashing treatment.

Further, as the case requires, it is preferred to form a photo-spacer on the black matrix comprising the partition walls to improve the product quality of a liquid crystal panel to be produced by using a color filter.

[Production of Organic EL Display Device]

After the partition walls are formed by the production process of the present invention as described above, an ink affinity-imparting treatment is carried out on the dots and an ink is injected within the dots by an ink jet method to form pixels thereby to produce an organic EL display device.

Before the partition walls are formed, a transparent electrode of e.g. indium tin oxide (ITO) is formed by e.g. a sputtering method on a transparent substrate of e.g. glass, and if necessary, the transparent electrode is etched to have a desired pattern. Then, the partition walls of the present invention are formed and the ink affinity-imparting treatment is carried out on the dots, and then by using an ink jet method, solutions of a hole transport material and a luminescent material are sequentially applied within the dots and dried to form a hole transport layer and a luminescent layer. Then, an electrode of e.g. aluminum is formed by e.g. a vapor deposition method, whereby pixels for an organic EL display device will be obtained.

[Production of Organic TFT Array]

After partition walls are formed by the production process of the present invention as described above, an ink affinity-imparting treatment is carried out on the dots, and an ink is injected within the dots by an ink jet method to form pixels thereby to produce an organic TFT array. More specifically, an organic TFT array can be produced by the following method.

(1) Partition walls of the present invention are formed on a transparent substrate of e.g. glass. After an ink affinity-imparting treatment on the dots, a solution of a gate electrode material is applied within the dots by using an ink jet method to form a gate electrode.

(2) After the gate electrode is formed, a gate insulating film is formed thereon. Partition walls of the present invention are formed on the gate insulating film, and an ink affinity-imparting treatment is carried out on the dots, and then by using an ink jet method, a solution of a source drain electrode material is applied within the dots to form a source drain electrode.

(3) After the source drain electrode is formed, partition walls of the present invention are formed to surround a region including a pair of such source drain electrodes, and an ink affinity-imparting treatment is carried out on the dots, and then by using an ink jet method, a solution of an organic semiconductor is applied within the dots to form an organic semiconductor layer between the source drain electrodes.

In the above steps (1) to (3), the partition walls of the present invention may be utilized only in one step, or the partition walls of the present invention may be utilized in two or more steps.

EXAMPLES

Now, the present invention will be described in further detail with reference to Examples, but the present invention is by no means restricted thereto.

Preparation Examples 1 to 5 are examples for preparation of an ink repellent (A) which the negative photosensitive composition of the present invention contains. Further, Comparative Preparation Example 1 is an example for preparation of a hydrolyzed condensate of hydrolyzable silane compounds wherein the component (a-1) is out of the range of the present invention and no component (a-2) is contained.

In the following description, "%" means "mass %" unless otherwise specified.

Preparation Example 1

Into a 100 cm$^3$ three-necked flask equipped with a stirrer, 4.0 g of $CF_3(CF_2)_5CH_2CH_2Si(OCH_3)_3$ (TSL8257, manufactured by Momentive Performance Materials Inc.), 1.75 g of $CH_3Si(OC_2H_5)_3$ (manufactured by TOKYO CHEMICAL INDUSTRY CO., LTD.), 0.15 g of $CH_2$=$CHCOO(CH_2)_3Si(OCH_3)_3$ (manufactured by TOKYO CHEMICAL INDUSTRY CO., LTD.) and 0.10 g of $(CH_3)_3SiOSi(CH_3)_3$ (manufactured by TOKYO CHEMICAL INDUSTRY CO., LTD.) were put.

Then, toluene (28 g) and isopropyl alcohol (12 g) were put.

1.2 g of a 1.28% hydrochloric acid aqueous solution was dropwise added to the above mixture with stirring at room temperature. After completion of the dropwise addition, stirring was carried out further for 8 hours. The solvent was removed to obtain a liquid, which is regarded as liquid A-1. The fluorine atom content of the obtained liquid A-1 is 47.1% (this value is a value calculated from a chemical formula assuming that all hydrolyzable groups in the hydrolyzable silane compounds as starting materials are converted to siloxane bonds to constitute a hydrolyzed condensate. The fluorine contents in the following Preparation Examples and Comparative Preparation Example are values obtained by the same calculation method). Further, the number average molecular weight of liquid A-1 was 4,250.

Preparation Example 2

Into a 100 cm$^3$ three-necked flask equipped with a stirrer, 4.0 g of $CF_3(CF_2)_5CH_2CH_2Si(OCH_3)_3$ (TSL8257, manufactured by Momentive Performance Materials Inc.), 2.70 g of $CH_3Si(OC_2H_5)_3$ (manufactured by TOKYO CHEMICAL INDUSTRY CO., LTD.), 0.20 g of $CH_2$=$CHCOO(CH_2)_3Si(OCH_3)_3$ (manufactured by TOKYO CHEMICAL INDUSTRY CO., LTD.) and 0.14 g of $(CH_3)_3SiOSi(CH_3)_3$ (manufactured by TOKYO CHEMICAL INDUSTRY CO., LTD.) were put.

Then, toluene (28 g) and isopropyl alcohol (12 g) were put.

1.6 g of a 1.28% hydrochloric acid aqueous solution was dropwise added to the above mixture with stirring at room temperature. After completion of the dropwise addition, stirring was carried out further for 8 hours. The solvent was removed to obtain a liquid, which is regarded as liquid A-2. The fluorine atom content of the obtained liquid A-2 is 42.0%. Further, the number average molecular weight of liquid A-2 was 3,850.

Preparation Example 3

Into a 100 cm$^3$ three-necked flask equipped with a stirrer, 4.0 g of $CF_3(CF_2)_5CH_2CH_2Si(OCH_3)_3$ (TSL8257, manufactured by Momentive Performance Materials Inc.), 4.65 g of $CH_3Si(OC_2H_5)_3$ (manufactured by TOKYO CHEMICAL INDUSTRY CO., LTD.), 0.30 g of $CH_2=CHCOO(CH_2)_3Si(OCH_3)_3$ (manufactured by TOKYO CHEMICAL INDUSTRY CO., LTD.) and 0.21 g of $(CH_3)_3SiOSi(CH_3)_3$ (manufactured by TOKYO CHEMICAL INDUSTRY CO., LTD.) were put.

Then, toluene (28 g) and isopropyl alcohol (12 g) were put.

2.4 g of a 1.28% hydrochloric acid aqueous solution was dropwise added to the above mixture with stirring at room temperature. After completion of the dropwise addition, stirring was carried out further for 8 hours. The solvent was removed to obtain a liquid, which is regarded as liquid A-3. The fluorine atom content of the obtained liquid A-3 is 34.5%. Further, the number average molecular weight of liquid A-3 was 3,400.

Preparation Example 4

Into a 100 cm$^3$ three-necked flask equipped with a stirrer, 4 g of $CF_3(CF_2)_3CH_2CH_2Si(OCH_3)_3$ (manufactured by Asahi Glass Company, Limited), 0.97 g of $CH_3Si(OC_2H_5)_3$ (manufactured by TOKYO CHEMICAL INDUSTRY CO., LTD.), 0.13 g of $CH_2=CHCOO(CH_2)_3Si(OCH_3)_3$ (manufactured by TOKYO CHEMICAL INDUSTRY CO., LTD.) and 0.087 g of $(CH_3)_3SiOSi(CH_3)_3$ (manufactured by TOKYO CHEMICAL INDUSTRY CO., LTD.) were put.

Then, toluene (28 g) and isopropyl alcohol (12 g) were put.

1 g of a 1.28% hydrochloric acid aqueous solution was dropwise added to the above mixture with stirring at room temperature. After completion of the dropwise addition, stirring was carried out further for 8 hours. The solvent was removed to obtain a liquid, which is regarded as liquid A-4. The fluorine atom content of the obtained liquid A-4 is 47.5%. Further, the number average molecular weight of liquid A-4 was 3,140.

Preparation Example 5

Into a 50 cm$^3$ three-necked flask equipped with a stirrer, 1 g of $CF_3(CF_2)_5CH_2CH_2Si(OCH_3)_3$ (manufactured by Asahi Glass Company, Limited), 2.2 g of $Si(OC_2H_5)_4$ (manufactured by COLCOAT CO., Ltd.) and 1.25 g of $CH_2=CHCOO(CH_2)_3Si(OCH_3)_3$ (manufactured by TOKYO CHEMICAL INDUSTRY CO., LTD.) were put. Then, PGMEA (15 g) was put.

2.34 g of a 1.28% hydrochloric acid aqueous solution was dropwise added to the above mixture with stirring at room temperature. After completion of the dropwise addition, stirring was carried out further for 5 hours. The resulting liquid is regarded as liquid A-5. The fluorine atom content of a composition having the solvent in the obtained liquid A-5 removed is 21.5%. Further, the number average molecular weight of the composition having the solvent in liquid A-5 removed was 1,250.

Comparative Preparation Example 1

Into a 100 cm$^3$ three-necked flask equipped with a stirrer, 4.0 g of $CF_3CH_2CH_2Si(OCH_3)_3$ (TSL8262, manufactured by Momentive Performance Materials Inc.), 0.13 g of $CH_2=CHCOO(CH_2)_3Si(OCH_3)_3$ (manufactured by TOKYO CHEMICAL INDUSTRY CO., LTD.) and 0.09 g of $(CH_3)_3SiOSi(CH_3)_3$ (manufactured by TOKYO CHEMICAL INDUSTRY CO., LTD.) were put.

Then, toluene (28 g) and isopropyl alcohol (12 g) were put.

1.0 g of a 1.28% hydrochloric acid aqueous solution was dropwise added to the above mixture with stirring at room temperature. After completion of the dropwise addition, stirring was carried out further for 8 hours. The solvent was removed to obtain a liquid, which is regarded as liquid A'-6. The fluorine atom content of the obtained liquid A'-6 is 35.9%. Further, the number average molecular weight of liquid A'-6 was 3,250.

Example 1

(Preparation of Negative Photosensitive Composition-Containing Coating Liquid)

1.59 g of CCR-1115 (cresol novolac type epoxy acrylate, manufactured by Nippon Kayaku Co., Ltd., photosensitive resin (B)), 2 g of a 50% diglyme solution of A9530 (a mixture of dipentaerythritol hexaacrylate with dipentaerythritol pentaacrylate, manufactured by SHIN-NAKAMURA CHEMICAL CO., LTD., radical crosslinking agent (D)), 0.27 g of a 50% diglyme solution of IRGACURE 907 (2-methyl-1-[4-(methylthio)phenyl]-2-morpholinopropan-1-one, manufactured by Ciba Geigy Company, photopolymerization initiator (C)), 0.34 g of a 50% diglyme solution of diethyldiaminobenzophenone (manufactured by TOKYO CHEMICAL INDUSTRY CO., LTD., sensitizer), 0.49 g of a 50% diglyme solution of 157S70 (epoxy resin, manufactured by Japan Epoxy Resins, Co., Ltd., heat crosslinking agent (E)), 0.6 g of a 1% diglyme solution of liquid A-1 (ink repellent (A)), 0.1 g of KBM403 (manufactured by Shin-Etsu Chemical Co., Ltd., silane coupling agent (G)) and 0.76 g of diglyme were put in a container for stirring and stirred for 30 minutes to prepare a coating liquid having diglyme added as a solvent to the negative photosensitive composition of the present invention.

(Preparation of Coating Film Cured Product)

A 5 cm square glass substrate was subjected to ultrasonic cleaning with ethanol for 30 seconds and then subjected to UV/$O_3$ (UV ozone) cleaning for 5 minutes. For the above UV/$O_3$ cleaning, PL7-200 (Senengineering Co., Ltd.) was used as a UV ozone (UV/$O_3$) generator. For all the following UV ozone treatment, this apparatus was used as the UV ozone (UV/$O_3$) generator.

On the above glass substrate after cleaned, the above obtained negative photosensitive composition-containing coating fluid was applied by using a spinner and dried by heating on a hot plate at 100° C. for 2 minutes to form a coating film having a thickness of 2.0 μm. The surface of the obtained coating film was irradiated with 100 mJ/cm$^2$ of ultraviolet rays from a high pressure mercury lamp for 10 seconds from the coating film side via a photomask having an open pattern (2.5 cm×5 cm).

Then, the above glass substrate on which the coating film was formed and which was subjected to the exposure treatment, was dipped in a 0.1% tetramethylammonium hydroxide aqueous solution for 40 seconds for development, and the coating film on the non-exposed portion was washed off with water, followed by drying. Then, the glass substrate was heated on a hot plate at 230° C. for 20 minutes to obtain glass substrate (1) on which a coating film cured product of the negative photosensitive composition having the above open pattern size was formed.

(Evaluation of Ink Repellency and Ink Affinity at Exposed Portion and Non-Exposed Portion)

The contact angles of the surface of the coating film cured product (exposed portion) and the surface of the glass substrate (non-exposed portion on which the coating film was removed by development, hereinafter simply referred to as "non-exposed portion") of glass substrate (1) obtained by the above steps to water and PGMEA were measured by the following methods. Then, UV/$O_3$ application was carried out for 5 minutes on the entire surface on the side where the coating film cured product was formed of glass substrate (1) on which the coating film cured product was formed, obtained by the above steps. The contact angles of the surface of the coating film cured product and the surface of the glass substrate at the non-exposed portion to water and PGMEA were measured after every one minute of irradiation, and the changes were evaluated. The measurement results are shown in Table 1.

<Measurement Method>

The contact angle to water was measured by putting water droplets on three different spots on the surface of the substrate to be measured, and each droplet was measured in accordance with JIS R3257 "Testing Method of Wettability of Glass Substrate" by the sessile drop test method. The droplet was 2 μL/droplet, and the measurement was carried out at 20° C. The contact angle is represented by an average value of three droplets (n=3).

The contact angle to PGMEA was measured by putting PGMEA droplets on three different spots on the surface of the substrate to be measured, and each droplet was measured in accordance with JIS R3257 "Testing Method of Wettability of Glass Substrate" by the sessile drop test method. The droplet was 2 μL/droplet, and the measurement was carried out at 20° C. The contact angle is represented by an average value of three droplets (n=3).

TABLE 1

| Measurement sample | | Contact angle (degree) after each UV/$O_3$ irradiation time (min) UV/$O_3$ irradiation time (min) | | | | | |
|---|---|---|---|---|---|---|---|
| | | 0 | 1 | 2 | 3 | 4 | 5 |
| Surface of coating film cured product | Water | 99 | 92 | 94 | 89 | 77 | 65 |
| | PGMEA | 54 | 52 | 50 | 49 | 46 | 42 |
| Non-exposed portion | Water | 51 | 20 | 18 | 4 | 6 | 7 |
| | PGMEA | 5 | 8 | 7 | 8 | 5 | 2 |

As shown in Table 1, the contact angles of the surface of the coating film cured product of glass substrate (1) obtained by the above steps to water and PGMEA were 99° and 54°, respectively. Further, the contact angles of the surface of the glass substrate at the non-exposed portion to water and PGMEA were 51° and 5°, respectively. It was found from the contact angles of the surface of the coating film cured product that the surface of the coating film cured product had water repellency and oil repellency.

Further, after the UV/$O_3$ irradiation was carried out for 3 minutes, the contact angles of the surface of the glass substrate at the non-exposed portion to water and PGMEA were decreased to 10° or below. This means that residues such as the non-exposed photosensitive composition at the non-exposed portion were sufficiently removed, and the ink affinity is imparted. At this time, the contact angles of the surface of the coating film cured product to water and PGMEA were 89° and 49°, respectively, and were maintained to be sufficiently high. Thus, it was found that the ink affinity was imparted to the non-exposed portion without decreasing the water repellency and the oil repellency on the surface of the coating film cured product.

Example 2

A coating liquid containing a negative photosensitive composition was prepared in the same manner as in Example 1 except that liquid A-2 was used instead of liquid A-1 as the ink repellent (A). Further, glass substrate (2) on which a coating film cured product of the negative photosensitive composition was formed was obtained in the same manner as in Example 1 by using the obtained coating liquid containing a negative photosensitive composition. With respect to glass substrate (2), in the same manner as in Example 1, the ink repellency and the ink affinity were evaluated by UV/$O_3$ irradiation for 5 minutes with respect to the surface of the coating film cured product and the surface of the glass substrate at the non-exposed portion. The results are shown in Table 2.

TABLE 2

| Measurement sample | | Contact angle (degree) after each UV/$O_3$ irradiation time (min) UV/$O_3$ irradiation time (min) | | | | | |
|---|---|---|---|---|---|---|---|
| | | 0 | 1 | 2 | 3 | 4 | 5 |
| Surface of coating film cured product | Water | 94 | 94 | 91 | 76 | 71 | 66 |
| | PGMEA | 53 | 52 | 47 | 46 | 42 | 37 |
| Non-exposed portion | Water | 55 | 25 | 12 | 10 | 11 | 12 |
| | PGMEA | 5 | 14 | 9 | 8 | 8 | 7 |

As shown in Table 2, after the UV/$O_3$ irradiation was carried out for 3 minutes, the contact angles of the surface of the glass substrate at the non-exposed portion to water and PGMEA were decreased to 10° or below. This means that residues such as the non-exposed photosensitive composition at the non-exposed portion were sufficiently removed, and the ink affinity is imparted. At this time, the contact angles of the surface of the coating film cured product to water and PGMEA were 76° and 46°, respectively, and were maintained to be high. Thus, it was found that the ink affinity was imparted to the non-exposed portion without decreasing the water repellency and the oil repellency on the surface of the coating film cured product.

Example 3

A coating liquid containing a negative photosensitive composition was prepared in the same manner as in Example 1 except that liquid A-3 was used instead of liquid A-1 as the ink repellent (A). Further, glass substrate (3) on which a coating film cured product of the negative photosensitive composition was formed was obtained in the same manner as in Example 1 by using the obtained coating liquid containing a negative photosensitive composition. With respect to glass substrate (3), in the same manner as in Example 1, the ink repellency and the ink affinity were evaluated by UV/$O_3$ irradiation for 5 minutes with respect to the surface of the coating film cured product and the surface of the glass substrate at the non-exposed portion. The results are shown in Table 3.

TABLE 3

| Measurement sample | | Contact angle (degree) after each UV/O₃ irradiation time (min) UV/O₃ irradiation time (min) | | | | | |
|---|---|---|---|---|---|---|---|
| | | 0 | 1 | 2 | 3 | 4 | 5 |
| Surface of coating film cured product | Water | 84 | 71 | 59 | 62 | 50 | 38 |
| | PGMEA | 29 | 38 | 30 | 27 | 24 | 21 |
| Non-exposed portion | Water | 51 | 19 | 25 | 16 | 11 | 6 |
| | PGMEA | 2 | 8 | 11 | 4 | 7 | 9 |

As shown in Table 3, after the UV/O₃ irradiation was carried out for 4 minutes, the contact angles of the surface of the glass substrate at the non-exposed portion to water and PGMEA were decreased to about 10°. This means that residues such as the non-exposed photosensitive composition at the non-exposed portion were sufficiently removed, and the ink affinity is imparted. At this time, the contact angles of the surface of the coating film cured product to water and PGMEA were 50° and 24°, respectively, and were maintained to be certain values. Thus, it was found that the ink affinity was imparted to the non-exposed portion without decreasing the water repellency and the oil repellency on the surface of the coating film cured product so much. The ink repellent (A) used in this Example had a relatively low fluorine atom content of 34.5% and it is thereby considered that the water repellency and the oil repellency were relatively low.

Example 4

A coating liquid containing a negative photosensitive composition was prepared in the same manner as in Example 1 except that liquid A-4 was used instead of liquid A-1 as the ink repellent (A). Further, glass substrate (4) on which a coating film cured product of the negative photosensitive composition was formed was obtained in the same manner as in Example 1 by using the obtained coating liquid containing a negative photosensitive composition. With respect to glass substrate (4), in the same manner as in Example 1, the ink repellency and the ink affinity were evaluated by UV/O₃ irradiation for 5 minutes with respect to the surface of the coating film cured product and the surface of the glass substrate at the non-exposed portion. The results are shown in Table 4.

TABLE 4

| Measurement sample | | Contact angle (degree) after each UV/O₃ irradiation time (min) UV/O₃ irradiation time (min) | | | | | |
|---|---|---|---|---|---|---|---|
| | | 0 | 1 | 2 | 3 | 4 | 5 |
| Surface of coating film cured product | Water | 92 | 91 | 80 | 61 | 52 | 44 |
| | PGMEA | 43 | 42 | 37 | 30 | 27 | 25 |
| Non-exposed portion | Water | 61 | 26 | 19 | 9 | 10 | 8 |
| | PGMEA | 9 | 11 | 10 | 8 | 9 | 5 |

As shown in Table 4, after the UV/O₃ irradiation was carried out for 3 minutes, the contact angles of the surface of the glass substrate at the non-exposed portion to water and PGMEA were decreased to 10° or below. This means that residues such as the non-exposed photosensitive composition at the non-exposed portion were sufficiently removed, and the ink affinity is imparted. At this time, the contact angles of the surface of the coating film cured product to water and PGMEA were 61° and 30°, respectively, and were maintained to be high. Thus, it was found that the ink affinity was imparted to the non-exposed portion without decreasing the water repellency and the oil repellency on the surface of the coating film cured product.

Example 5-1

1.59 g of CCR-1115 (cresol novolac type epoxy acrylate, manufactured by Nippon Kayaku Co., Ltd., photosensitive resin (B)), 2 g of a 50% PGMEA solution of A9530 (a mixture of dipentaerythritol hexaacrylate with dipentaerythritol pentaacrylate, manufactured by SHIN-NAKAMURA CHEMICAL CO., LTD., radical crosslinking agent (D)), 0.66 g of a 50% PGMEA solution of IRGACURE 907 (2-methyl-1-[4-(methylthio)phenyl]-2-morpholinopropan-1-one, manufactured by Ciba Geigy Company, photopolymerization initiator (C)), 0.88 g of a 50% PGMEA solution of diethyldiaminobenzophenone (manufactured by TOKYO CHEMICAL INDUSTRY CO., LTD.), sensitizer), 0.1 g of a 10.8% PGMEA solution of liquid A-5 (ink repellent (A)) and 1.54 g of PGMEA were put in a container for stirring and stirred for 30 minutes to prepare a coating liquid having PGMEA added as a solvent to the negative photosensitive composition of the present invention.

Using the obtained coating liquid containing the negative photosensitive composition, glass substrate (5) on which a coating film cured product of the negative photosensitive composition was formed was obtained in the same manner as in Example 1. With respect to glass substrate (5), in the same manner as in Example 1, the ink repellency and the ink affinity were evaluated by UV/O₃ irradiation for 5 minutes with respect to the surface of the coating film cured product and the surface of the glass substrate at the non-exposed portion. The results are shown in Table 5.

TABLE 5

| Measurement sample | | Contact angle (degree) after each UV/O₃ irradiation time (min) UV/O₃ irradiation time (min) | | | | | |
|---|---|---|---|---|---|---|---|
| | | 0 | 1 | 2 | 3 | 4 | 5 |
| Surface of coating film cured product | Water | 92 | 86 | 82 | 82 | 82 | 82 |
| | PGMEA | 46 | 42 | 42 | 42 | 38 | 35 |
| Non-exposed portion | Water | 56 | 31 | 10 | 5 | 4 | 3 |
| | PGMEA | 2 | 1 | 2 | 2 | 1 | 1 |

As shown in Table 5, after the UV/O₃ irradiation was carried out for 3 minutes, the contact angles of the surface of the glass substrate at the non-exposed portion to water and PGMEA were decreased to 10° or below. This means that residues such as the non-exposed photosensitive composition at the non-exposed portion were sufficiently removed, and the ink affinity is imparted. At this time, the contact angles of the surface of the coating film cured product to water and PGMEA were 82° and 42°, respectively, and were maintained to be high. Thus, it was found that the ink affinity was imparted to the non-exposed portion without decreasing the water repellency and the oil repellency on the surface of the coating film cured product.

Example 5-2

In the same manner as in Example 5-1 except that a photomask having a line/space of 20 μm, glass substrate (51) on which a coating film cured product of the negative photosensitive composition was formed was obtained. As observed by a laser microscope (manufactured by Keyence Corporation), it was found that banks having a height of 0.88 μm, a top width of 19.7 μm and a bottom width of 22.1 μm were formed.

Comparative Example 1

In the same manner as in Example 1 except that liquid A'-1 was used instead of liquid A-1 as the ink repellent (A), a coating liquid containing a negative photosensitive composition was prepared. Further, by using the obtained coating liquid containing a negative photosensitive composition, in the same manner as in Example 1, glass substrate (6) on which a coating film cured product of the negative photosensitive composition was formed was obtained. With respect to glass substrate (6), in the same manner as in Example 1, the ink repellency and the ink affinity were evaluated by $UV/O_3$ irradiation for 5 minutes with respect to the surface of the coating film cured product and the surface of the glass substrate at the non-exposed portion. The results are shown in Table 6.

TABLE 6

| Measurement sample | | Contact angle (degree) after each $UV/O_3$ irradiation time (min) $UV/O_3$ irradiation time (min) | | | | | |
| --- | --- | --- | --- | --- | --- | --- | --- |
| | | 0 | 1 | 2 | 3 | 4 | 5 |
| Surface of coating film cured product | Water | 66 | 47 | 36 | 32 | 25 | 17 |
| | PGMEA | 7 | 4 | 6 | 4 | 2 | 1 |
| Non-exposed portion | Water | 58 | 24 | 12 | 19 | 12 | 5 |
| | PGMEA | 2 | 4 | 3 | 3 | 1 | — |

As shown in Table 6, after the $UV/O_3$ irradiation was carried out for 4 minutes, the contact angles of the surface of the glass substrate at the non-exposed portion to water and PGMEA were decreased to about 10°. This means that residues such as the non-exposed photosensitive composition at the non-exposed portion were sufficiently removed, and the ink affinity is imparted. However, at this time, the contact angles of the surface of the coating cured product to water and PGMEA were so low as 25° and 2°, respectively. Further, the initial values of the contact angles to water and PGMEA were also so low as 66° and 7°, respectively. Accordingly, it was found that even though the fluorine atom content is at least 30%, the water repellency and the oil repellency were not exhibited nor maintained if a hydrolyzed condensate of hydrolyzable silane compounds other than the ink repellent (A) within the range of the present invention is used (the component (a-1) is out of the range of the present invention, and no component (a-2) is contained).

INDUSTRIAL APPLICABILITY

The ink repellent (A) in the present invention is excellent in the ink repellency and the UV ozone resistance. Accordingly, by using the negative photosensitive composition of the present invention comprising the ink repellent (A), it is possible to impart ink affinity to dots without decreasing the ink repellency of partition walls of a substrate for an optical device comprising dots and partition walls. Such a negative photosensitive composition of the present invention is suitably used for formation of partition walls for production of a color filter, for production of an organic EL display device, and production of an organic TFT array, utilizing ink jet recording technology.

The entire disclosure of Japanese Patent Application No. 2008-199863 filed on Aug. 1, 2008 including specification, claims, drawings and summary is incorporated herein by reference in its entirety.

MEANINGS OF SYMBOLS

1: Support substrate, 2: coating film of negative photosensitive composition, 3: coating film exposed portion, 4: mask, 5: light, 6: partition walls, 7: dots, 10: substrate for optical device to which ink jet method is applicable

What is claimed is:

1. A negative photosensitive composition, comprising:
ink repellent (A),
a photosensitive resin (B) having an acidic group and an ethylenic double bond in one molecule, and
a photopolymerization initiator (C),
wherein
the proportion of the ink repellent (A) is from 0.01 to 10 mass % to the total solid content of the composition,
ink repellent (A) has a fluorine atom content of from 10 to 55 mass %, and
said ink repellent (A) comprises a hydrolyzed condensate of at least three hydrolysable silane compounds, the three hydrolysable silane compounds respectively selected from the group consisting of:
a hydrolysable silane compound (a-1) having an organic group having one $C_{3-10}$ perfluoroalkyl group which may contain an etheric oxygen atom and three hydrolysable groups bonded to a silicon atom;
a hydrolysable silane compound (a-2) having p pieces of a hydrocarbon group(s) and (4-p) pieces of hydrolysable groups bonded to a silicon atom, where p is 0, 1, or 2; and
a hydrolysable silane compound (a-3) having q pieces of an organic group(s) having a polymerizable functional group selected from an acryloyl group and a methacryloyl group, r piece of a hydrocarbon group, and (4-q-r) pieces of hydrolysable groups bonded to a silicon atom, where q is 1 or 2, r is 0 or 1, and q+r=1 or 2.

2. The negative photosensitive composition according to claim 1, wherein the organic group which the hydrolysable silane compound (a-1) has is an organic group having a $C_{4-8}$ perfluoroalkyl group or a $C_{4-9}$ perfluoroalkyl group containing an etheric oxygen atom.

3. The negative photosensitive composition according to claim 1, wherein the ink repellent (A) has a fluorine atom content of from 30 to 55 mass %.

4. The negative photosensitive composition according to claim 1, wherein
the hydrolysable silane compound (a-1) is a compound represented by formula (a1), the hydrolysable silane compound (a-2) is a compound represented by formula (a2), and the hydrolysable silane compound (a-3) is a compound represented by formula (a3):

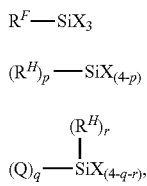

and wherein, in formulae (a1) to (a3), $R^F$ represents an organic group having a $C_{3-10}$ perfluoroalkyl group which may contain an etheric oxygen atom;
each $R^H$, individually, represents a hydrocarbon group;
each Q, individually, represents an organic group having a polymerizable functional group selected from an acryloyl group and a methacryloyl group;
each X, individually, represents a hydrolysable group;
p is 0, 1 or 2;
q is 1 or 2; and
r is 0 or 1, provided that q+r is 1 or 2.

5. The negative photosensitive composition according to claim 1, which further comprises a radical crosslinking agent (D) having at least two ethylenic double bonds and having no acidic group.

6. Partition walls for an optical device comprising a support substrate, and a plurality of pixels and partition walls located between the adjacent pixels formed on the support substrate, which are made of a coating film cured product of the negative photosensitive composition as defined in claim 1.

7. A process, which comprises, in order:
applying the negative photosensitive composition as defined in claim 1 onto a support substrate to form a coating film,
prebaking the coating film by heating the coating film,
exposing only a portion to be the partition walls of the coating film for photo-curing,
removing the coating film other than the photo-cured portion to form partition walls made of the photo-cured portion of the coating film, and
post-baking the formed partition walls by heating the formed partition walls,
thereby producing partition walls for an optical device comprising a support substrate, and a plurality of pixels and partition walls located between the adjacent pixels formed on the support substrate.

8. A process for producing an optical device comprising a support substrate, and a plurality of pixels and partition walls located between the adjacent pixels formed on the support substrate, which comprises forming partition walls on the support substrate by the production process as defined in claim 7, applying an ink affinity-imparting treatment to the surface of the support substrate exposed to regions surrounded by the support substrate and the partition walls, and injecting an ink within the regions by an ink jet method to form the pixels.

9. The process for producing an optical device according to claim 8, wherein the optical device is an organic EL display device, a color filter or an organic TFT array.

10. The process for producing an optical device according to claim 8, wherein the ink affinity-imparting treatment is one or more selected from the group consisting of UV cleaning, UV ozone cleaning, excimer cleaning, corona discharge treatment and oxygen plasma treatment.

11. The negative photosensitive composition according to claim 1, wherein said photosensitive resin (B) comprises, in reacted form, units represented by

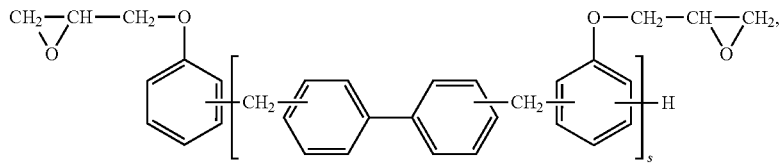

and wherein s represents an integer of from 1 to 50.

12. The negative photosensitive composition according to claim 11, wherein s represents an integer of from 2 to 10.

13. The negative photosensitive composition according to claim 1, wherein
said photosensitive resin (B) comprises, in reacted form, units represented by

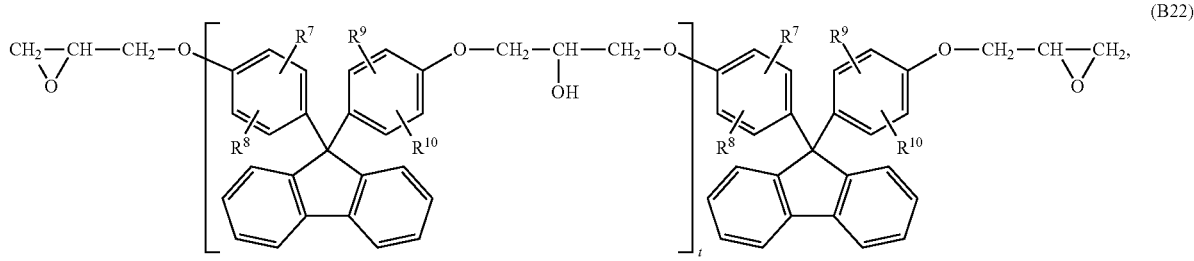

each of $R^7$, $R^8$, $R^9$ and $R^{10}$, independently, represents a hydrogen atom, a chlorine atom or a $C_{1-5}$ alkyl group, and
t represents an integer of from 0 to 10.

14. The negative photosensitive composition according to claim 1, wherein said photosensitive resin (B) comprises, in reacted form, units represented by

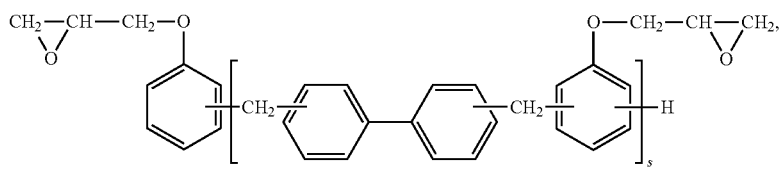

and units represented by

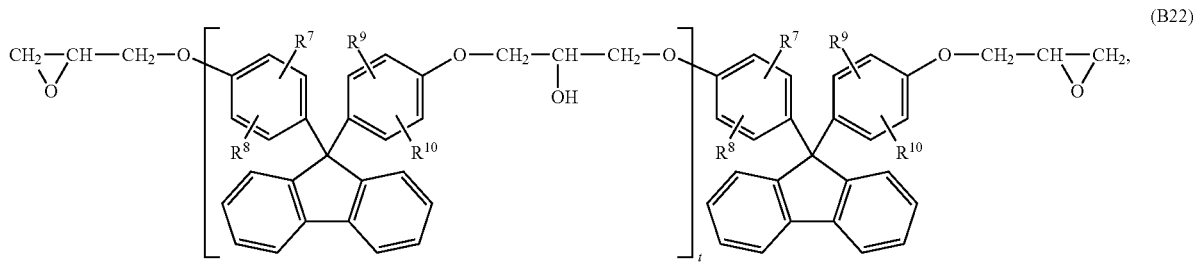

(B22)

and wherein represents an integer of from 1 to 50, each of $R^7$, $R^8$, $R^9$ and $R^{10}$, independently, represents a hydrogen atom, a chlorine atom or a $C_{1-5}$ alkyl group, and t represents an integer of from 0 to 10.

15. The negative photosensitive composition according to claim 14, wherein s represents an integer of from 2 to 10.

16. The negative photosensitive composition according to claim 1, wherein said photosensitive resin (B) has at least three ethylenic double bonds per molecule.

17. The negative photosensitive composition according to claim 1, wherein said photosensitive resin (B) has an acid value of from 10 to 300 mgKOH/g.

18. The negative photosensitive composition according to claim 1, wherein said photosensitive resin (B) has an acid value of from 30 to 150 mgKOH/g.

19. The negative photosensitive composition according to claim 1, wherein said photosensitive resin (B) has a number average molecular weight of from 500 to less than 20,000.

20. The negative photosensitive composition according to claim 1, wherein said photosensitive resin (B) has a number average molecular weight of from 2000 to less than 15,000.

* * * * *